United States Patent [19]
Hidaka

[11] Patent Number: 6,144,577
[45] Date of Patent: Nov. 7, 2000

[54] SEMICONDUCTOR MEMORY DEVICE HAVING MULTIBIT DATA BUS AND REDUNDANT CIRCUIT CONFIGURATION WITH REDUCED CHIP AREA

[75] Inventor: Hideto Hidaka, Hyogo, Japan

[73] Assignee: Mitsubishi Denki Kabushiki Kaisha, Tokyo, Japan

[21] Appl. No.: 09/326,981

[22] Filed: Jun. 3, 1999

[30] Foreign Application Priority Data

Dec. 11, 1998 [JP] Japan ................................ 10-353100

[51] Int. Cl.⁷ ...................................................... G11C 5/06
[52] U.S. Cl. ......................... 365/63; 365/212; 365/230.03
[58] Field of Search ........................ 365/63, 200, 189.04, 365/189.07, 189.08, 230.03, 212

[56] References Cited

U.S. PATENT DOCUMENTS

| | | | |
|---|---|---|---|
| 5,274,593 | 12/1993 | Proebsting ................................ | 365/200 |
| 5,502,675 | 3/1996 | Kohno et al. ............................. | 365/200 |
| 5,652,725 | 7/1997 | Suma et al. ............................... | 365/200 |
| 5,930,194 | 7/1999 | Yamagata et al. .................. | 365/230.03 |

FOREIGN PATENT DOCUMENTS 7-122096  5/1995  Japan .

OTHER PUBLICATIONS

"Ultra LSI Memory", by Kiyoo Ito, Advanced Electronics Series, Nov. 1994, pp. 166–175, 180–183 (with partial translations of pp. 168–169 and pp. 181–183).

"A Flexible Redundancy Technique for High–Density DRAM's", by Horiguchi, et al., IEEE Journal of Solid–State Circuits, vol. 26, No. 1, Jan. 1991, pp. 12–17.

*Primary Examiner*—David Nelms
*Assistant Examiner*—Thong Le
*Attorney, Agent, or Firm*—McDermott, Will & Emery

[57] ABSTRACT

Each global data bus is selectively connected via a connection circuit to any of local data buses associated with subarrays arranged on either side of the global data bus. Between row blocks is arranged a connection controlling circuit outputting a control signal which controls connection of the connection circuit. In each connection controlling circuit, a fuse corresponding to a location of a subarray including a defective memory cell is cut to provide column substitution without changing an order of global data buses.

11 Claims, 24 Drawing Sheets

| X0 | NORMAL MEMORY SUBARRAY | MA#0 } RBX#0 |
| SPDX | SPARE ARRAY | SPX# |
| X1 | NORMAL MEMORY SUBARRAY | MA#1; RBX#1 |
| X2 | NORMAL MEMORY SUBARRAY | MA#2; RBX#2 |
| ⋮ | ⋮ | |
| Xm | NORMAL MEMORY SUBARRAY | MA#m; RBX#m |

6,144,577

SEMICONDUCTOR MEMORY DEVICE HAVING MULTIBIT DATA BUS AND REDUNDANT CIRCUIT CONFIGURATION WITH REDUCED CHIP AREA

BACKGROUND OF THE INVENTION

1. Field of the Invention

The present invention relates to semiconductor memory devices and in particular to dynamic semiconductor memory devices.

2. Description of the Background Art

In recent years, semiconductor memory devices have data bus configurations which are effective in reduction of wiring delay to achieve faster operation.

FIG. 25 is a conceptual view showing a hierarchical data bus. This configuration has been introduced by Kiyoo Ito in *Ultra LSI Memory*, Baihukan, pp. 168–169.

The semiconductor memory device shown in FIG. 25 has memory blocks #0 to #k−1 arranged adjacently and having columns selected by a common column decoder and driver. A column selected in each memory block is connected to a respectively associated local data bus.

In FIG. 25, a column selected in memory block #k−1 is connected to a local data bus I/O1 which is connected to a main data bus I/O2. Then a main amplifier MA1 amplifies the data which is in turn transmitted to a global data bus I/O3 and further transmitted by a main amplifier MA2 externally.

This configuration is characterized in that by dividing a local data bus the load capacity of a data bus to be driven by a sense amplifier provided in a block can be reduced to accommodate faster operation without increasing the load driving capability of the sense amplifier provided in the block.

A semiconductor memory device is also adapted to replace a defective memory cell existing therein with a spare memory cell to equivalently repair the defective memory cell and thus improve product yield. In a redundant circuit configuration provided with a spare memory cell (spare word and bit lines) for such repair of a defective memory cell, to improve the utilization efficiency of a spare line (a word line or bit line) and that of a spare decoder for selecting the spare line, a flexible redundancy technique has been proposed (see, e.g., Horiguchi et al., "A Flexible Redundancy Technique for High-Density DRAM's", IEEE JOURNAL OF SOLID-STATE CIRCUITS, VOL. 26 NO. 1, JANUARY, 1991, pp. 12–17).

FIG. 26 schematically shows the entire configuration of a semiconductor memory device in a conventional, flexible redundancy configuration.

Referring to FIG. 26, the semiconductor memory device includes four memory arrays MA0–MA3. In each of memory arrays MA0–MA3, a spare word line is arranged for repairing a defective memory cell row. Spare wordlines SW00 and SW01, SW10 and SW11, SW20 and SW21, and SW30 and SW31 are arranged in memory arrays MA0, MA1, MA2 and MA3, respectively.

Respectively associated with memory arrays MA0–MA3, row decoders X0–X3 are arranged for driving to selected state a normal word line corresponding to an addressed row.

A column decoder Y0 for decoding a column address signal and selecting an addressed column is arranged between memory arrays MA0 and MA1, and a column decoder Y1 is arranged between memory arrays MA2 and MA3.

The semiconductor memory device also includes spare decoders SD0–SD3 for storing a row address having a defective memory cell and holding a word line corresponding to the defective row address (or a defective normal word line) in non-selected state and driving a corresponding spare word line to selected state when the defective row address is addressed, and an OR circuit G0 receiving a signal output from spare decoders SD0 and SD1 and an OR circuit G1 receiving a signal output from spare decoders SD2 and SD3.

A signal output from OR circuits G0 and G1 is supplied commonly to spare word line drive circuits included respectively in row decoders X0 to X3. Spare decoders SD0–SD3 receive common array address signal bits an-2 and an-1 addressing one of memory arrays MA to MA3 and common in-array address signal bits a0 to an-3 addressing a row in a memory array.

When array address signal bits an-2 and an-1 are supplied and a memory array corresponding thereto is addressed, one of row decoders X0–X3 that is associated with the addressed memory array is activated. OR circuits G0 and G1 are associated with the two spare word lines, respectively, provided in each of memory arrays MA0–MA3.

For example, if memory array MA0 has defective normal word lines W0 and W1, memory array MA1 has a defective normal word line W2 and memory array MA2 has a defective normal word line W3, then the address of normal word line W0 is programmed in spare decoder SD0, the address of normal word line W1 is programmed in spare decoder SD2, the address of normal word line W2 is programmed in spare decoder SD3 and the ad dress of normal word line W3 is programmed in spare decoder SD1.

A signal output from OR circuit G0 designates any of spare word lines SW00, SW10, SW20 and SW30, and a signal output from OR circuit G1 selects any of spare word lines SW01, SW11, SW21 and SW31.

When normal word line W0 is designated, a signal output from spare decoder SD0 is driven to selected state and a signal output from OR circuit G0 is activated. In this state, array address signal bits an-2 and an-1 activates row decoder X0 and the remaining row decoders X1–X3 are held inactive.

Thus the word line drive circuit included in row decoder X0 drives spare word line SW00 to selected state in response to the signal output from OR circuit G0, while a decode circuit provided in row decoder X0 and associated with normal word line W0 is held inactive. Thus, defective normal word line W0 is substituted by spare word line SW00.

Similarly, defective normal word lines W1, W2 and W3 are substituted by spare word lines SW01, SW11 and SW20, respectively.

In the flexible redundancy configuration shown in FIG. 24, one spare word line can be activated by any of a plurality of spare decoders. For example, spare word line SW20 can be driven to selected state by spare decoder SD0 or SD1.

Furthermore, one spare decoder can drive any of a plurality of spare word lines to selected state. For example, spare decoder SD0 can drive any of spare word lines SW00, SW10, SW20 and SW30 to selected state.

Thus the correspondence between spare word line and spare decoder is not one to one and this can enhance the utilization efficiency of spare word line and spare decoder.

More specifically, a spare decoder can be shared by memory arrays to eliminate the necessary of providing a spare decoder for each spare word line and thus reduce chip occupied area.

With such a data bus configuration as the hierarchical data bus configuration described above, substituting a defective normal column with a spare column requires considering how a spare column be arranged, since a local data bus is divided within one memory block.

In such an embedded application as incorporating a semiconductor memory device into a semiconductor memory device as one block, using a multibit data bus to transfer data allows faster operation and the number of data buses is thus increased. When the number of data buses is increased, consideration must be taken of how a spare column be arranged.

In the flexible redundancy configuration described above, a defective row is repaired through substitution using a spare word line arranged in a memory array including the defective row. Thus, each memory array is disadvantageously required to have a spare word line arranged therein and this degrades the utilization efficiency of the spare word line. Substituting a defective normal word line of a memory array with a spare word line of another memory array to improve the utilization efficiency of the spare word line is not taken into consideration at all, since such substitution would entail complicated control of the circuitry associated with the memory arrays and is thus considered to be avoided.

SUMMARY OF THE INVENTION

An object of the present invention is to provide a semiconductor memory device with a multibit data bus, having a redundant circuit configuration advantageous in both operating speed and occupied area in substitution of a defective column.

Another object of the present invention is to provide a semiconductor memory device improved in the utilization efficiency of a spare word line in repairing a defective row.

Briefly speaking, the present invention is a semiconductor memory device constructed on a main surface of a semiconductor substrate, including first to nth memory cell blocks, first to nth local data buses, first to mth global data buses, first to mth connection circuits and a connection controlling circuit, wherein n represents a natural number and m represents a natural number smaller than n.

The first to nth memory cell blocks each have memory cells arranged in rows and columns. The first to nth local data buses are provided for the first to nth memory cell blocks, respectively. The first to mth global data buses communicate stored data with the semiconductor memory device. The first to mth connection circuits are provided for the first to mth global data buses, respectively. An ith one of the first to mth connection circuits selectively connects any one of ith to (i+n−m)th local data buses to an ith global data bus in response to an ith control signal. Wherein i represents a natural number of one to m. The connection controlling circuit outputs first to mth control signals to connect respectively the first to mth global data buses to m ones of the first to nth local data buses.

In another aspect of the present invention, a semiconductor memory device includes a memory cell array, an address program circuit, an address comparing circuit and an address addition circuit.

The memory cell array has memory cells arranged in rows and columns. The memory cell array has redundancy, with the number of the memory cells larger than that of memory cells that corresponds to the maximal value of an accessed address input to the semiconductor memory device. In the address program circuit, a defective address corresponding to a defective one of memory cells is set and the address program circuit outputs the defective address. The address comparing circuit compares an accessed address to a defective address and determines which address is larger. In response to an output from the address comparing circuit the address addition circuit adds a predetermined value to an accessed address to output a converted address. According to the converted address the memory cell array communicates stored data to avoid accessing the defective memory cell.

In still another aspect of the present invention, a semiconductor memory device constructed on a main surface of a semiconductor substrate includes first to nth banks, a global data bus, a plurality of local data buses and a cache block, wherein n represents a natural number of no less than two.

The first to nth banks each have memory cells arranged in rows and columns, each operable independently. The global data bus is shared by the first to nth banks. The plurality of local data buses respectively communicate data between the first to nth banks and the global data bus.

The first bank includes a plurality of normal rows, a plurality of spare rows capable of substituting for any defective row in the first to nth banks that includes a defective memory cell, a plurality of normal bit line pairs shared by the plurality of normal rows and the plurality of spare rows, a plurality of sense amplifiers amplifying potential differences respectively caused in the plurality of normal bit line pairs, and a gate circuit selectively connecting one of the plurality of bit line pairs to an associated local data bus. The cache block includes a cache row provided for the first bank and communicating data with the global data bus when two rows of the normal and spare rows of the first bank are accessed simultaneously.

Thus a main advantage of the present invention is that in a configuration having a large number of data buses a column redundancy system can be achieved without changing an order of the data buses and a complex order switching circuit can thus be dispensed with to reduce chip area and also achieve rapid operation.

A another advantage of the present invention is that in a multibank configuration, flexible row redundancy can be achieved and thus redundant repairing ability can be enhanced and chip area can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
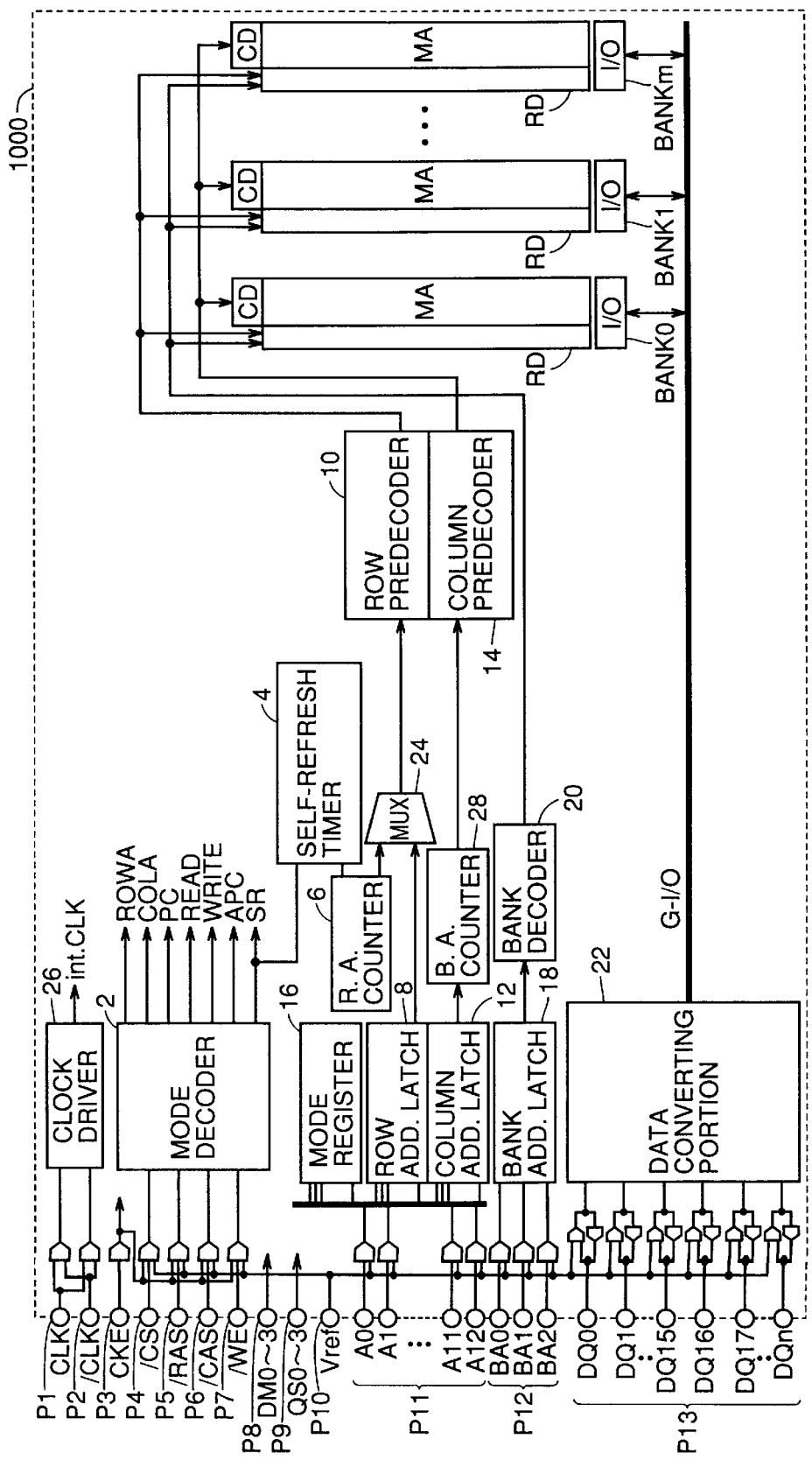
FIG. 1 is a schematic block diagram showing a configuration of a semiconductor memory device 1000 according to a first embodiment of the present invention.

Hereinafter the embodiments of the present invention will now be described in detail with reference to the drawings. It should be noted that same reference characters in the figures denote identical or corresponding portions.

First Embodiment

FIG. 1 is a schematic block diagram showing a configuration of a semiconductor memory device 1000 according to a first embodiment of the present invention.

Referring to FIG. 1, semiconductor memory device 1000 is a double data rate, synchronous dynamic random access memory (referred to as a "DDR SDRAM" hereinafter).

Semiconductor memory device 1000 includes terminals P1 and P2 receiving complementary clock signals CLK and /CLK serving as a reference for general operation, a terminal P3 receiving a clock enable signal CKE enabling an input to a chip, a terminal P4 receiving a signal /CS identifying an input of a command, a terminal P5 receiving a signal /RAS indicating that a row-related command has been input, a terminal P6 receiving a signal /CAS indicating that a column-related command has been input, a terminal P7 receiving a signal /WE discriminating between read and write, a group of terminals P8 receiving and outputting data mask signals DM0–DM3 determining that data in a read or write is invalid, a group of terminals P9 receiving and outputting data strobe signals QS0–QS3 determining a timing of data in a read or write, a terminal P10 receiving a reference potential Vref determining the high level/low level of an input signal, a group of terminals P11 receiving address signals A0–A12, a group of terminals P12 receiving bank addresses BA0–BA2 of incorporated, m memory banks, and a group of terminals P13 receiving and outputting input/output signals DQ0 to DQn of data of n bits.

Semiconductor memory device 1000 does not operate when enable signal CKE is inactive. During the inactive period, the semiconductor memory device is placed in standby state or self-refresh state.

With signal /CS activated, at a rising edge of a clock a command is recognized. Data mask signals DM0–DM2 indicate that data is invalid in a read when they are transmitted from the semiconductor memory device side to a controller IC. Data mask signals DM0–DM2 indicate that data is invalid in a write when they are transmitted from controller IC to the semiconductor memory device. One data mask signal DM is allocated to eight data input/output signals DQs.

Similarly, data strobe signal QS transmits a timing of data from the semiconductor memory device side to controller IC in a read and from controller IC to the semiconductor memory device side in a write. One data strobe signal QS is allocated to eight data input/output signals DQs.

Among address signals A0–A12, all of the 13 bits are used as an input of a row address and 10 of the 13 bits are used as an input of a column address. Part of the address signals are also used for writing in the mode register.

Semiconductor memory device 1000 also includes a clock driver 26 receiving clock signals CLK and /CLK and supplying an internal clock signal int. CLK to an internal block, a mode decoder 2 recognizing a command input, a mode register 16 holding a mode of operation, a row address latch 8 taking in a row address from an address terminal, a column address latch 12 taking in a column address from an address terminal, a bank address latch 18 taking in a bank address signal from a block address, and a bank decoder 20 decoding a bank address output from bank address latch 18 to activate a bank corresponding to the decoded bank address.

Semiconductor memory device 1000 also includes a self-refresh timer 4 and a refresh address counter 6 for producing a refresh address in refresh operation, a multiplexer 24 selecting one of an address output from row address latch 8 and an address output from refresh address counter 6, a row predecoder 10 receiving an address output from multiplexer 24 and outputting a signal corresponding thereto to row decoder RD, a burst address counter 28 producing successive column addresses in burst operation, and a column predecoder 14 receiving an address output from burst address counter 28 and outputting a signal corresponding thereto to column decoder CD.

Semiconductor memory device 1000 also includes a data converting portion 22 providing data-rate conversion and data communication between data terminal group P13 and a global data bus G-I/O, and (m+1) memory banks BANK0–BANKm communicating data with global data bus G-I/O in response to an output from row predecoder 10, that from column predecoder 14 and that from bank decoder 20, wherein m represents a natural number.

Figure 2:
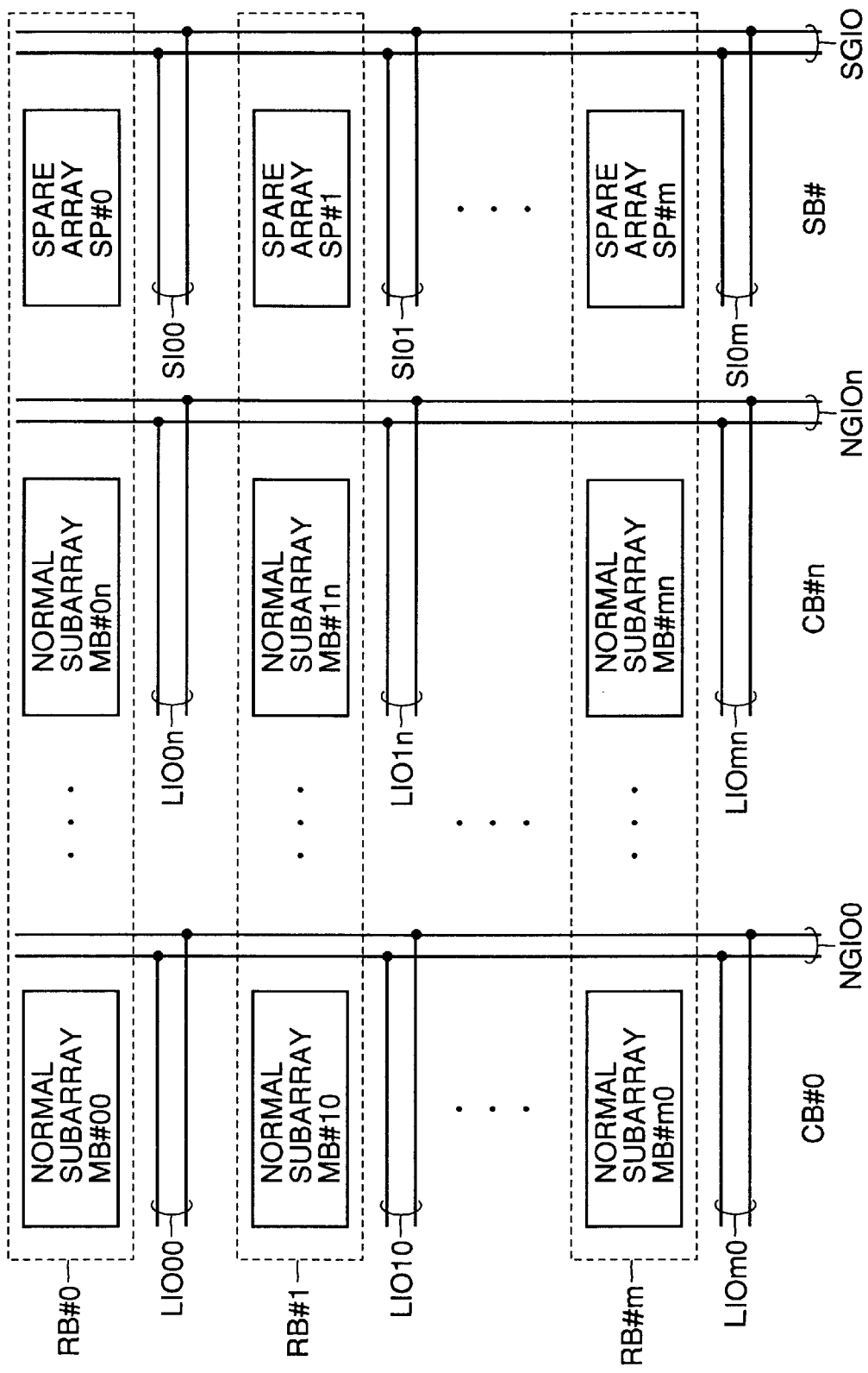
FIG. 2 schematically shows a configuration of an array portion of a multibit data bus system developed from a hierarchical data bus configurations.

FIG. 2 schematically shows a configuration of an array portion of a multibit data bus system developed from a hierarchical data bus configuration.

Referring to FIG. 2, the memory array is divided into a plurality of sense amplifier blocks (or row blocks) RB#0–RB#m, wherein m represents a natural number. Row blocks RB#0–RB#m are each divided into a plurality of subarrays. More specifically, a row block RB#i is divided into normal subarrays MB#i0–MB#in, wherein i is zero to m and n is a natural number. Normal subarrays MB#i0–MB#in each have a plurality of memory cells arranged in rows and columns.

Row blocks RB#0–RB#m are also provided with spare arrays SP#0–SP#m, respectively, to substitute for and thus repair a defective column (a column including a defective, normal memory cell) of the respectively associated row blocks RB#0–RB#m. Spare arrays SP#0–SP#m each have memory cells (or spare memory cells) arranged in a plurality of columns. The number of rows of spare arrays SP#0–SP#m is the same as that of rows included in the normal subarrays. In each row block RB#i, normal subarrays MB#i0–MB#in and spare array SP#i share word lines (or rows) and sense operation is performed for each sense amplifier block, wherein i is zero to m.

Normal subarrays MB#00–M13#mn are respectively provided with normal local data buses LIO00–LIOmn which communicate data only with their respectively associated normal subarrays MB#00–MB#mn.

Normal subarrays aligned in the column direction form column blocks CB#0–CB#n.

Associated with spare arrays SP#0–SP#m, spare local data buses SIO0–SIOm are also arranged, respectively. Spare arrays SP#0–SP#m form a column block SB#. Spare local data buses SIO0–SIOm communicate data only with their respectively associated spare arrays SP#0–SP#m. Normal global data buses NGIO0–NGIOn are arranged for normal subarrays aligned in the column direction, i.e., column blocks CB#0–CB#n, respectively, and are coupled with normal local data buses provided for normal subarrays of their respectively associated column blocks.

Spare local data buses SIO0–SIOm are also coupled with a spare global data bus SGIO.

Since row block RB#i includes spare array SP#i provided for the plurality of normal subarrays MB#i0–MB#in in common, with i being zero to m, a spare column included in spare array SP#i can substitute for a defective column in any of normal subarrays MB#i0–MB#in to improve the utilization efficiency of the spare column.

Figure 3:
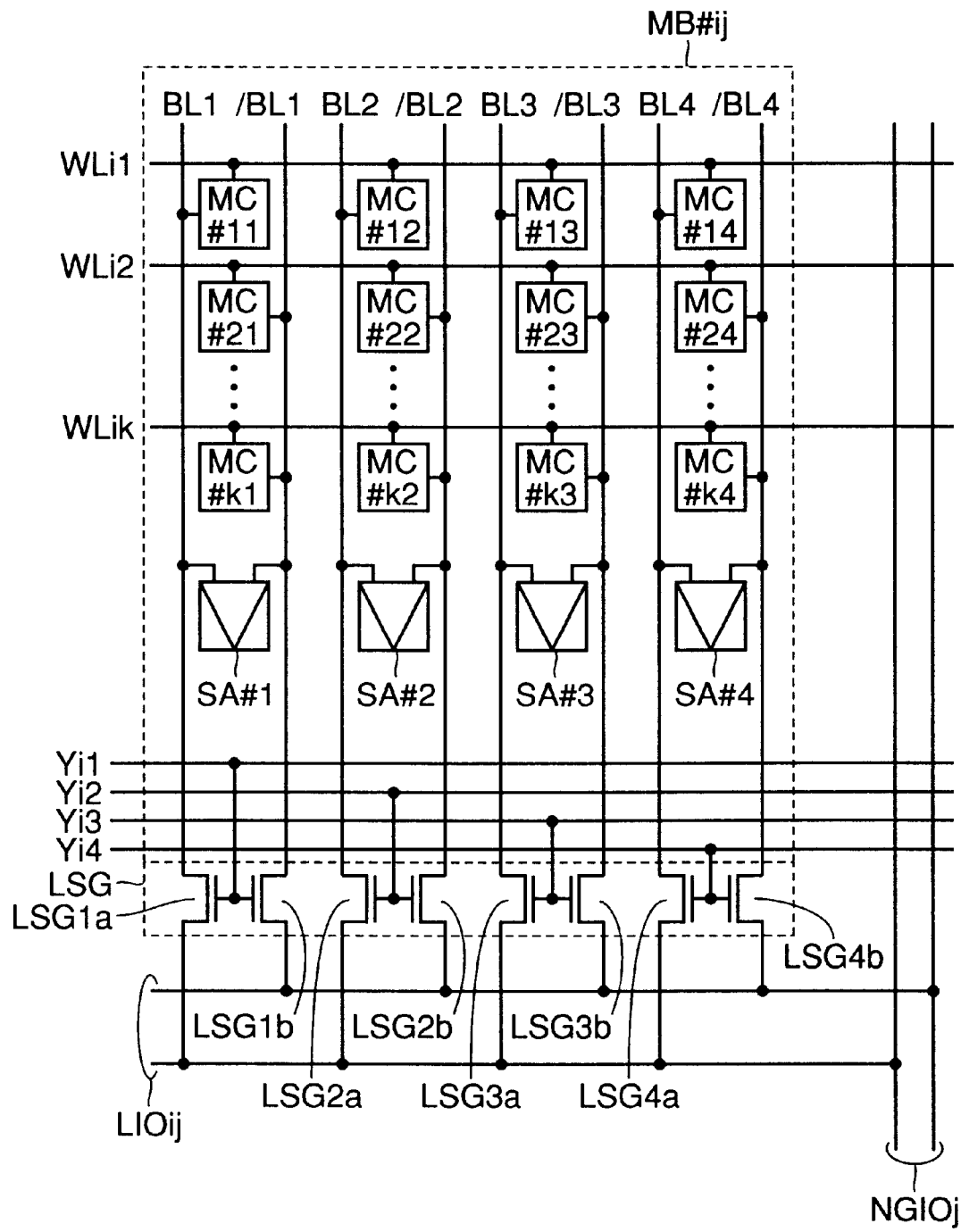
FIG. 3 is a circuit diagram for illustrating a connection between the normal subarray and local data bus shown in FIG. 2 associated therewith.

FIG. 3 is a circuit diagram for illustrating a connection between a normal subarray and a local data bus associated therewith in FIG. 2.

Referring to FIG. 3, a normal subarray MB#ij includes word lines WLi1–WLik, wherein k represents a natural number. Normal subarray MB#ij also includes bit lines BL1 and /BL1, BL2 and /BL2, BL3 and IBL3, and BL4 and /BL4 orthogonal to the word lines. To simplify the description the normal subarray is shown as including four bit line pairs, although it actually includes more bit line pairs.

A memory cell MC#11 is provided corresponding to an intersection of word line WLi1 and bit line BL1. Similarly, memory cells MC#12, MC#13, MC#14 are provided corresponding to the respective intersections of word line WLi1 and bit lines BL2, BL3, BL4. Memory cells MC#21, MC#22, MC#23, MC#24 are provided corresponding to the respective intersections of word line WLi2 and bit lines /BL1, /BL2, /BL3, /BL4. Similarly, memory cells MC#k12, MC#k2, MC#k3, MC#k4 are provided corresponding to the respective intersections of word line WLik and bit lines /BL1, /BL2, /BL3, /BL4.

Normal subarray MB#ij also includes sense amplifiers SA#1, SA#2, SA#3, SA#4 provided for bit lines BL1 and /BL1, BL2 and /BL2, BL3 and /BL3, BL4 and /BL4, respectively. Each bit line is connected to a local data bus LIOij via a column select gate LSG. Column select gate LSG includes column select gates LSG1a and LSG1b activated by a column select signal Yi1 to respectively connect bit lines BL1 and /BL1 to local data bus LIOij, column select gates LSG2a and LSG2b activated by a column select signal Yi2 to respectively connect bit lines BL2 and /BL2 to local data bus LIOij, column select gates LSG3a and LSG3b activated by a column select signal Yi3 to respectively connect bit lines BL3 and /BL3 to local data bus LIOij, and column select gates LSG4a and LSG4b activated by a column select signal Yi4 to respectively connect bit lines BL4 and /BL4 to local data bus LIOij.

The configuration of the multibit data bus system described above allows a large number of global data bus to be arranged across a memory cell array and is thus suitable for an embedded application which requires a large number of parallel data buses.

With this configuration, a plurality of sense amplifier blocks traversed by a global data bus can be allocated to a plurality of banks to readily achieve a multibank configuration.

If a spare column is arranged in a configuration with the multibit data bus system as described above, however, substitution will be provided for each global data bus. A group of spare global data buses is placed at a specific portion of the memory cell array so as to substitute for one or more of a large number of normal global buses. Therefore a normal global data bus may sometimes be replaced by a spare global data bus at a considerable distance from it.

Figure 4:
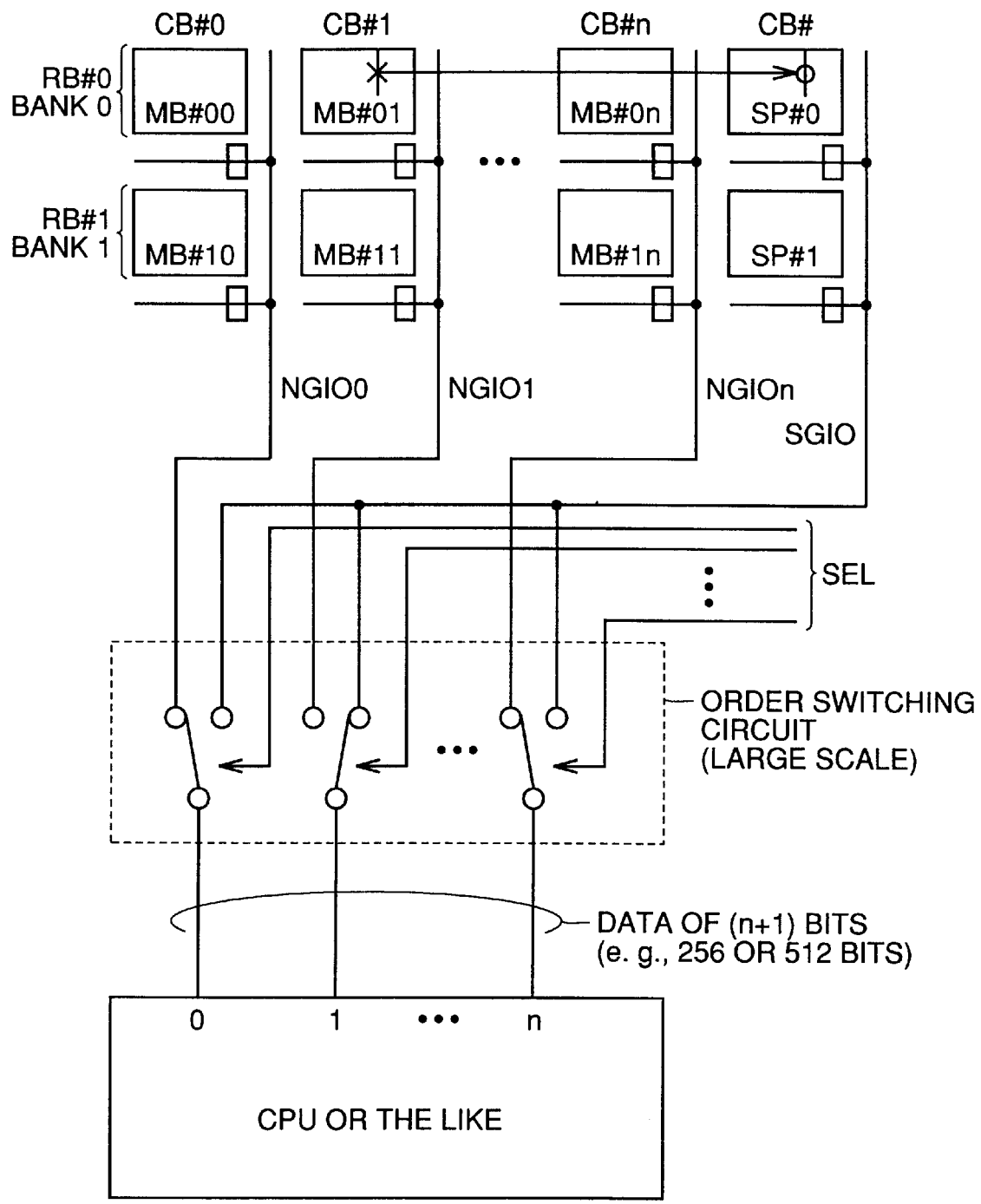
FIG. 4 is a conceptual view for describing a disadvantage of spare column substitution in a multibit data bus system.

FIG. 4 is a conceptual view for describing a disadvantage in spare-column substitution in a multibit data bus system.

Referring to FIG. 4, when row block RB#0 is allocated to bank0 and a defective column of normal subarray MB#01 is substituted by a spare column of spare subarray SP#0, normal global data bus NGIO1 should be switched with spare global bus SGIO, since the data of the spare column should be transferred to the CPU's data input terminal of the first bit.

In an embedded application, data is transferred from a memory portion to a CPU and the like via a large number, e.g., 256 or 512 pairs of global data bus lines and this entails an order switching circuit for switching between spare global data bus SGIO and normal global data bus NGIO1 when a column is substituted. Providing such an order switching circuit requires a large number of switches and a circuit for selecting and controlling the switches, and thus drastically increases the number of peripheral circuits and results in increased chip area.

Figure 5:
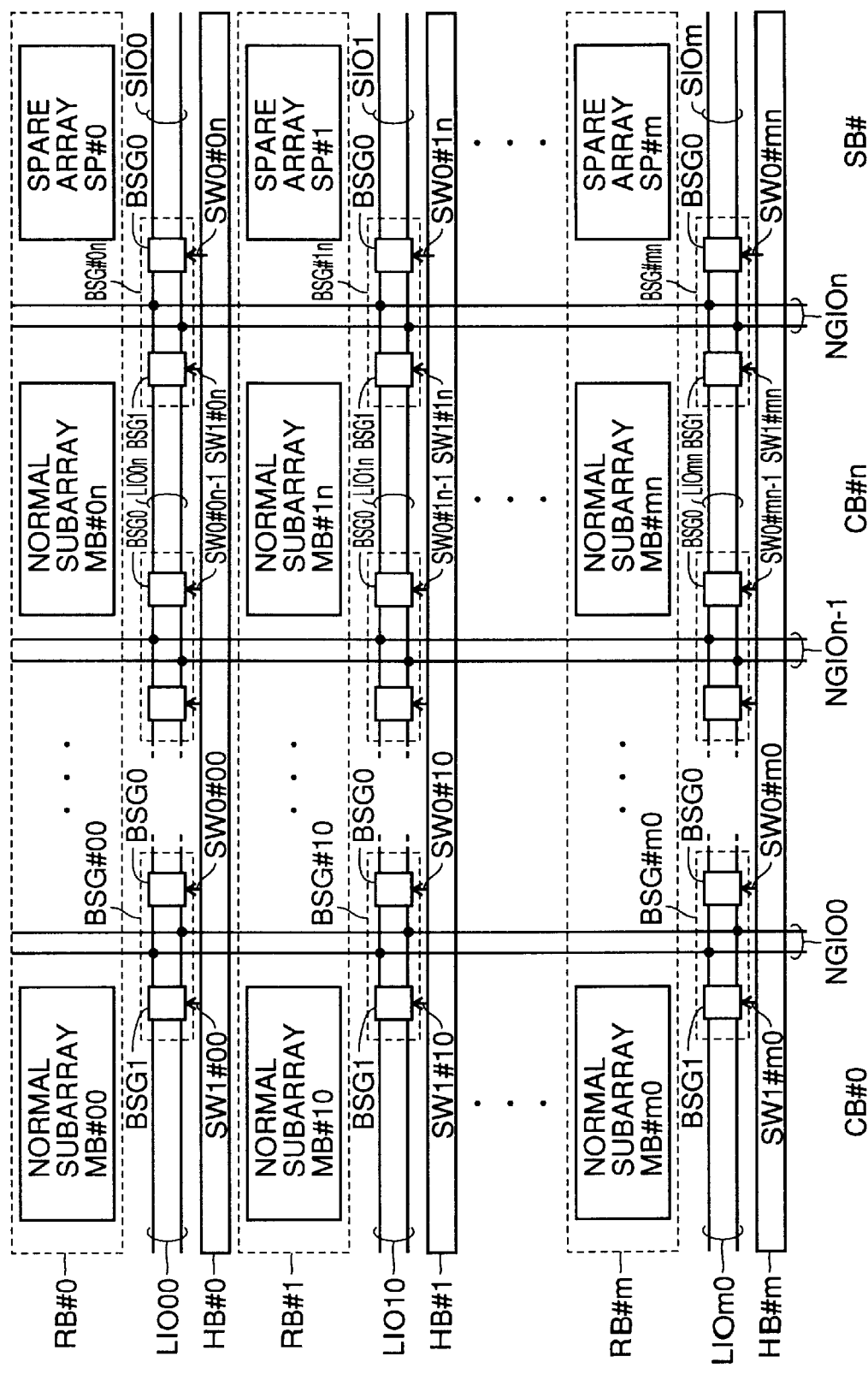
FIG. 5 schematically shows a configuration of an array portion of the semiconductor memory device according to the first embodiment.

FIG. 5 schematically shows a configuration of an array portion of a semiconductor memory device according to the first embodiment.

Referring to FIG. 5, the memory array is divided into a plurality of sense amplifier blocks (or row blocks) RB#0–RB#m each divided into a plurality of subarrays, wherein m represents a natural number. A row block RB#i is divided into normal subarrays MB#i0–MB#in each having a plurality of memory cells arranged in rows and columns, wherein i is zero to m and n represents a natural number.

Row block RB#0–RB#m are also provided with spare arrays SP#0–SP#m to substitute for and repair a defective column (a column including a defective, normal memory cell) of their respectively associated row blocks RB#0–RB#m. Spare arrays SP#0–SP#m each have memory cells (or spare memory cells) arranged in a plurality of columns. It should be noted that the number of rows of spare arrays SP#0–SP#m is the same as that of rows included in the normal subarrays. In each row block RB#i, normal subarrays MB#i0–MB#in and spare array SP#i share word lines (or rows) and sense operation is performed for each sense amplifier block, wherein i is zero to m.

Normal subarrays aligned in the column direction form column blocks CB#0–CB#n. Spare arrays SP#0–SP#m form a column block SB#.

Normal global data bus NGIOj connects with block select gates BSG#0j–BSG#mj each including connection gates BSG1 and BSG0 and connected to their respectively associated rows, wherein j is zero to n.

Row blocks RB#0–RB#m are provided with connection controlling circuits HB#0–HB#m, respectively. A connection controlling circuit HB#i outputs control signals SW1#i0–SW1#in to connection gate BSG1 of the associated block select gate BSG#ij, and outputs control signals SW0#i0–SW1#in to connection gate BSG0 of the associated block select gate BSG#ij, wherein i is zero to m and j is zero to n.

Subarrays MB#i0–MB#in are provided with local data buses LIOi0–LIOin, respectively, and spare array SP#i is provided with a spare local data bus SIOi, wherein i is zero to m. Local data buses LIOi0–LIOin communicate data only with their respectively associated subarrays MB#i0–MB#in, and spare local data buses SIO0–SIOm communicate data only with their respectively associated spare arrays SP#0–SP#m.

Via connection gates BSG0 and BSG1 in block select gate BSG#ij associated, normal global data bus NGIOj connects with local data bus LIO#ij or LIO#i (j+1), wherein j is zero to (n−1) and i is zero to m.

Via connection gates BSG0 and BSG1 in block select gate BSG#in associated, normal global data bus NGIOn connects with local data bus LIO#in or SIO#i, wherein i is zero to m.

Since row block RB#i has spare array SP#i shared by a plurality of normal subarrays MB#i0–MB#in, a spare column included in spare array SP#i can be used for normal subarrays MB#i0–MB#in to improve the utilization efficiency of the spare column.

Figure 6:
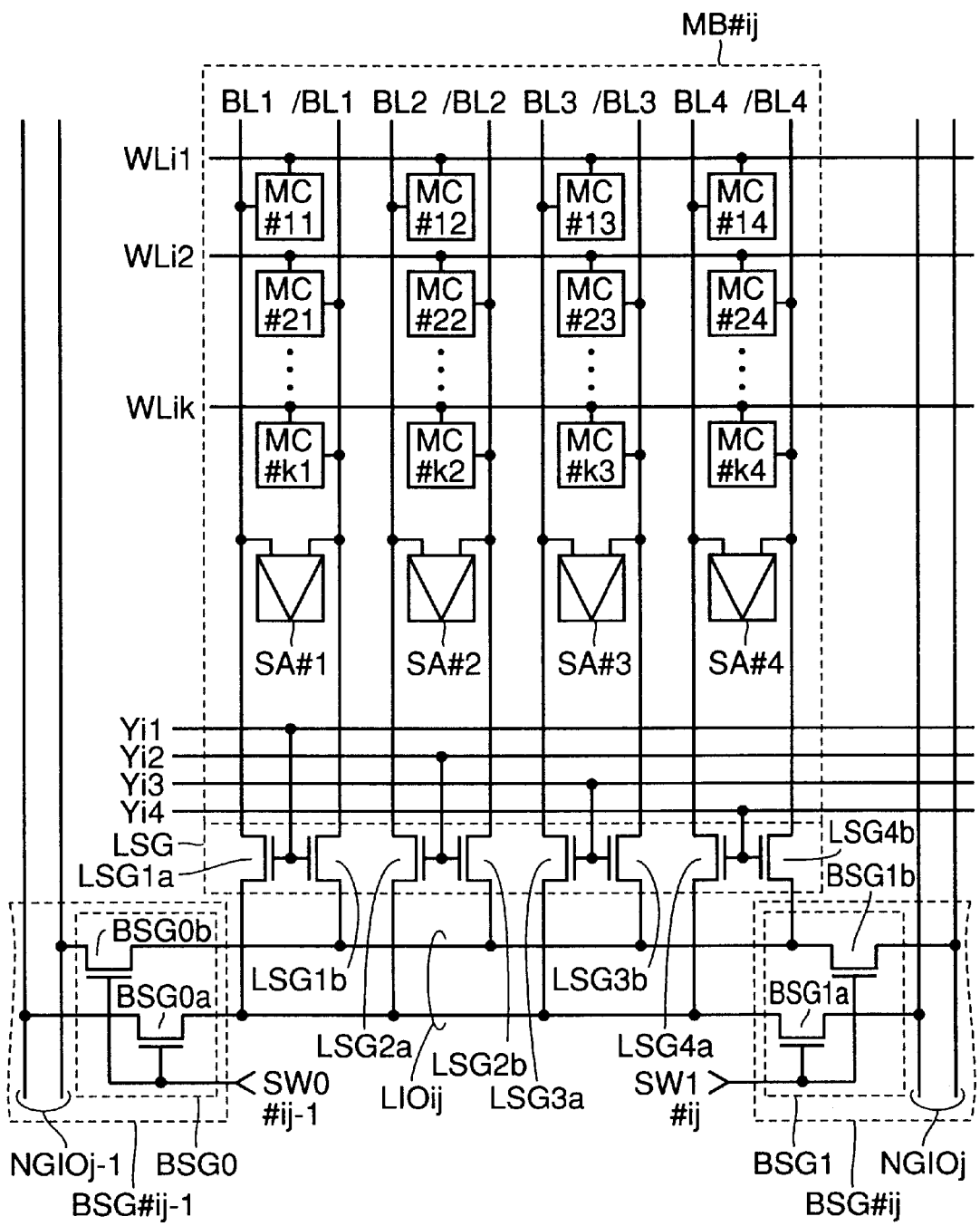
FIG. 6 is a circuit diagram for illustrating a connection between the normal subarray, local data bus and global data bus shown in FIG. 5.

FIG. 6 is a circuit diagram for illustrating a connection between a normal subarray and a local data bus and a global data bus shown in FIG. 5.

The connecting portion shown in FIG. 6 differs from that shown in FIG. 3 in the provision of connection gate BSG0 connecting local data bus LIOij to normal global data bus NGIOj−1 in response to control signal SW0#ij−1 and connection gate BSG1 connecting local data bus LIOij to normal global data bus NIGOj in response to control signal SW1#ij. In FIG. 6, connection gates BSG0 and BSG1 are included in block select gates BSG#ij−1 and BSG#ij, respectively.

Connection gate BSG0 includes a select gate BSG0a connecting one data line of local data bus LIOij and one data line of normal global data bus NGIOj−1 together in response to control signal SW1#ij−1 activated, and a select gate BSG0b connecting the other data line of local data bus LIOij and the other data line of normal global data bus NGIOj−1 together in response to control signal SW0#ij−1 activated.

Connection gate BSG1 includes a select gate BSG1a connecting one data line of local data bus LIOij and one data line of normal global data bus NGIOj together in response to control signal SW1#ij activated, and a select gate BSG1b connecting the other data line of local data bus LIOij and the other data line of normal global data bus NGIOj together in response to control signal SW1#ij activated.

Figure 7:
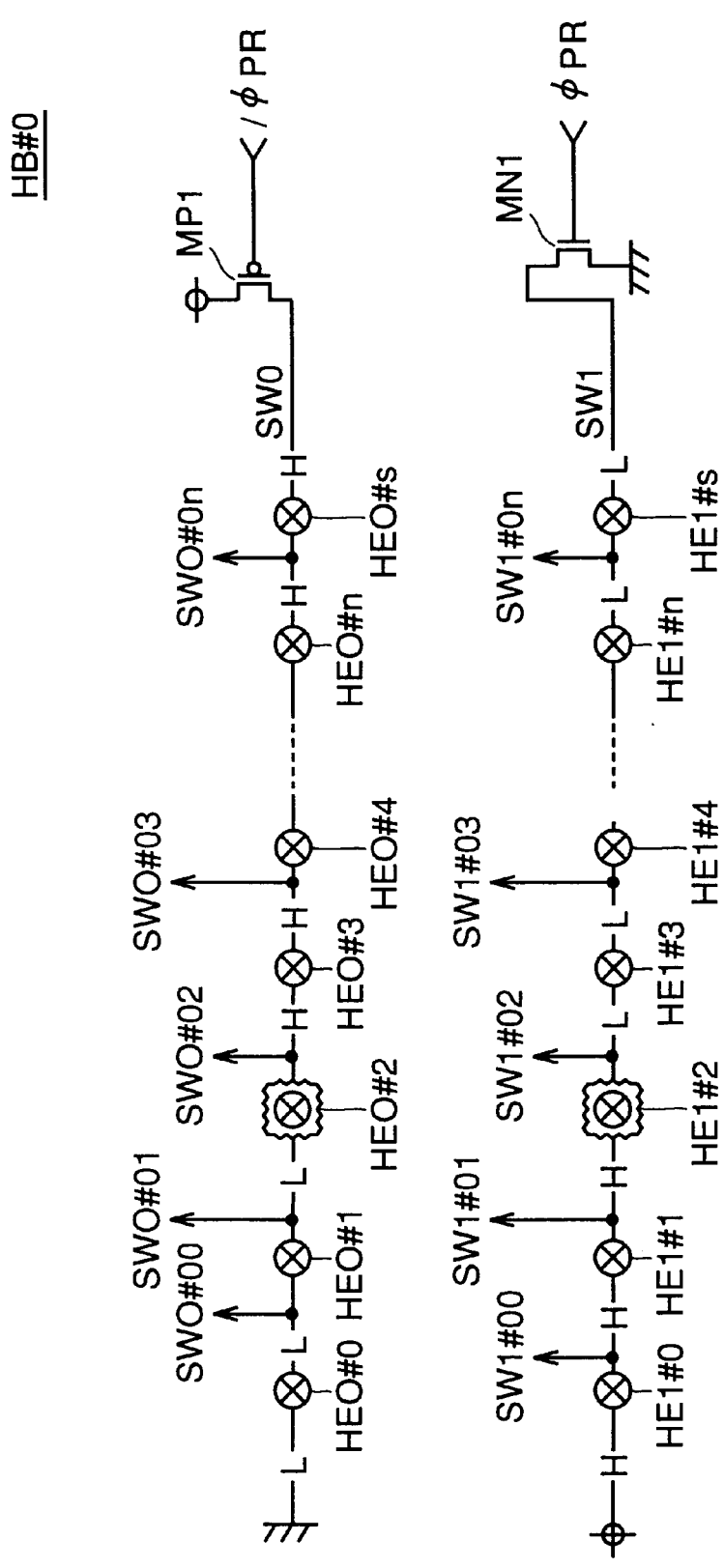
FIG. 7 is a circuit diagram showing a configuration of the connection controlling circuit HB#0 shown in FIG. 5.

FIG. 7 is a circuit diagram showing a configuration of the connection controlling circuit HB#0 shown in FIG. 5.

Connection controlling circuit HB#0 includes a p-channel MOS transistor MP1 having the gate receiving a precharge signal /φPR and the source coupled with a power supply potential, and fuse elements HE0#0–HE0#n and HE0#s connected in series between a ground node and the drain of p-channel MOS transistor MP1. A connection node between fuse elements HE0#i and HE0#i+1 outputs control signal SW0#0i, wherein i is zero to (n−1). A connection node between fuse elements HE0#n and HE0#s outputs control signal SW0#0n.

Connection controlling circuit HB#0 also includes an n-channel MOS transistor MN1 having the gate receiving precharge signal φPR and the source connected to a ground node, and fuse elements HE1#0–HE1#n and HE1#s connected in series between a power supply node and the drain of n-channel MOS transistor MN1. A connection node between fuse elements HE1#i and HE1#i+1 outputs control signal SW1#0i, wherein i is zero to (n−1). An output node of fuse elements HE1#n and HE1#s outputs control signal SW1#0n.

Other connection controlling circuits HB#1–HB#m are similar in configuration and will thus not be described.

The case where fuse elements HE1#2 and HE0#2 are cut for substitution with a spare will now be considered. While the fuse elements are typically cut by laser beam after a defective-address test is performed, they can be fused and thus cut, e.g., by passing current. A fuse element can be replaced with a MOS transistor or the like having the gate receiving a signal corresponding to a defective address stored in a non-volatile memory device.

When a precharge period completes and precharge signal φPR goes low, control signals SW0#00–SW0#01 go low and fuse elements SW0#02–SW0#0n and SW0#s0 go high. Control signals SW1#00–SW1#01 also go high and control signals SW1#02–SW1#0n go low. Thus, in the row block RB#0 shown in FIG. 5, normal subarrays MB#00 and MB#01 have connection gate BSG1 activated and are thus connected to normal global data buses NGIO0 and NGIO1, respectively. Normal subarrays MB#03–MB#0n and spare array SP#0 have connection gate BSG0 activated and are thus connected to normal global data buses NGIO2–NGIOn, respectively.

Normal subarray MB#02 is not connected to any global data bus, since control signals SW0#01 and SW1#02 are both held low. Thus normal subarray MB#02 is not used (or contains a defective column).

Figure 8:
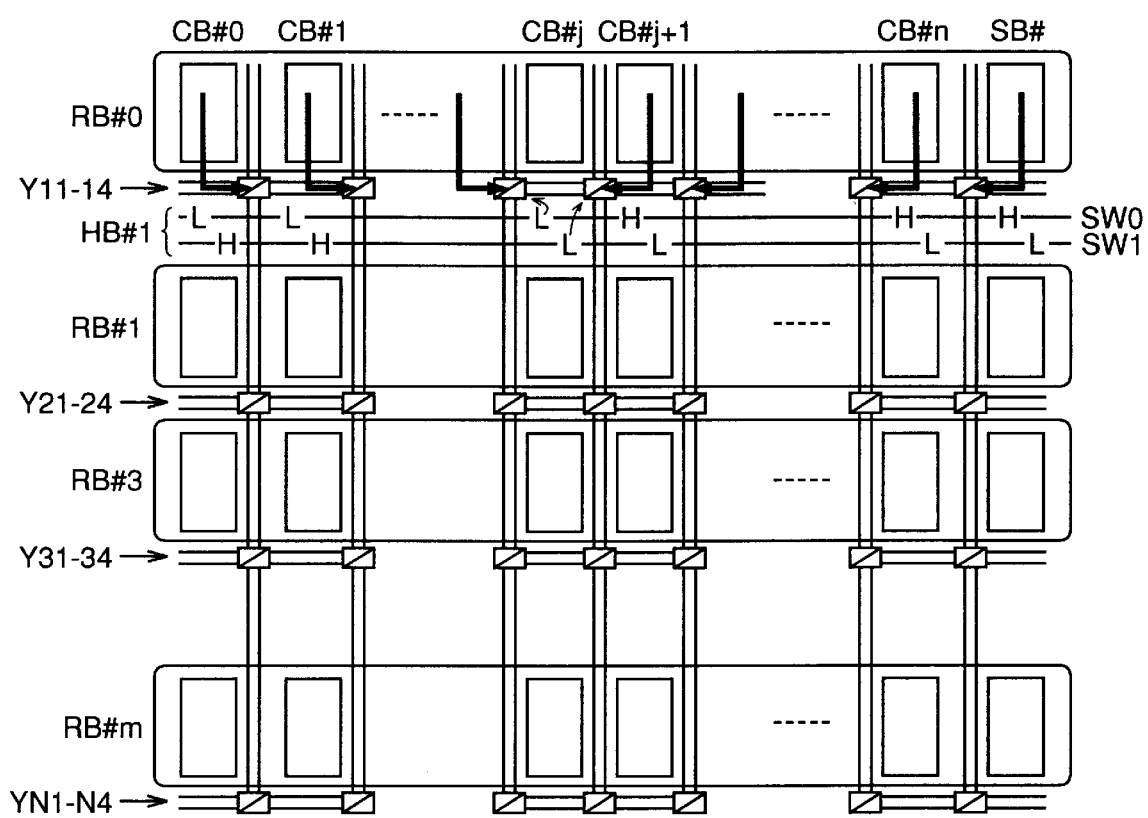
FIG. 8 schematically shows how a block is selected.

FIG. 8 schematically presents how a block is selected.

Referring to FIG. 8, in row block RB#0 the control signals SW0 and SW1 corresponding to column block CB#j are both held low. Thus, column block CB#j is not connected to any global data bus, while column blocks CB#0 to CB#j−1 each output data to a global data bus arranged immediately on the right hand thereof and column blocks CB#j+1 to CB#n and SB# each output data to a global data bus arranged immediately on the left hand thereof. More specifically, each global data bus is provided with a connecting switch to two sets of local data buses that are most adjacent to the global data bus. Also, a local data bus and a subarray associated therewith is provided redundantly for each row block. By switching two sets of switches provided for each global data bus, a redundancy system capable of inputting and outputting data can be provided without changing an order of the global data buses. It is advantageous for economy of area to arrange connection controlling circuit HB#0 in a region between row blocks RB#0 and RB#1 and arrange connection controlling circuit HB#i similarly in a region between row blocks RB#i and RB#i+1, as shown in FIGS. 5 and 8, wherein i is 1 to (n−1).

While FIGS. 5–8 show an example with each global data bus provided with a connecting switch to two sets of local data buses that are most adjacent to the global data bus, each global data bus can readily be provided with a connecting switch, e.g., to three sets of local data buses that are adjacent to the global data bus.

Thus the semiconductor memory device according to the first embodiment can achieve a column redundancy system in a configuration with a large number of data buses that does not change an order of the data bus and can thus also be dispensed with a complex, order switching circuit to reduce chip area and also achieve rapid operation.

Second Embodiment

A second embodiment is the another embodiment which overcomes a disadvantage similar to that described with reference to the first embodiment.

Figure 9:
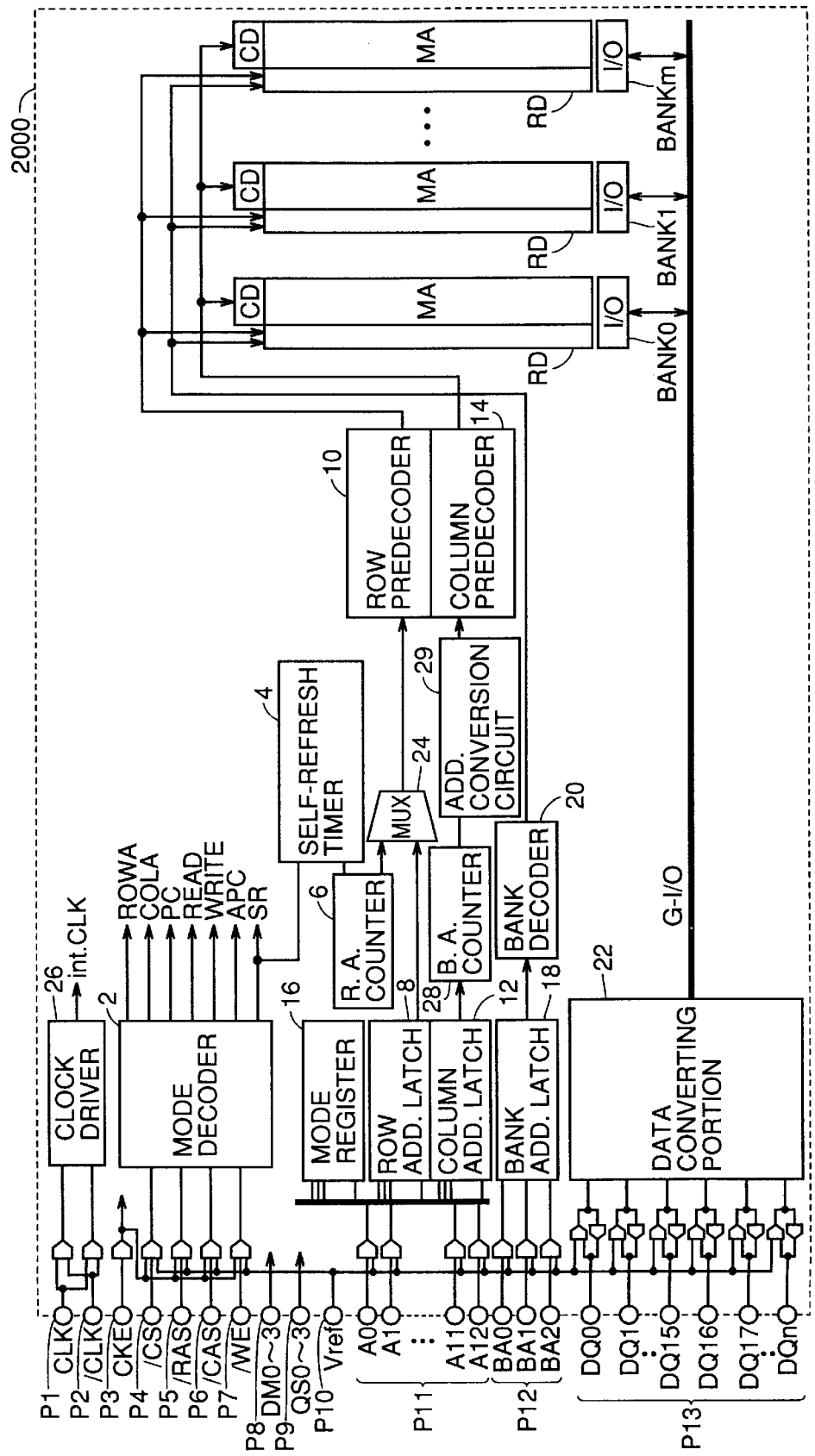
FIG. 9 is a block diagram showing a schematic configuration of a semiconductor memory device 2000 according to a second embodiment of the present invention.

FIG. 9 is a block diagram showing a schematic configuration of a semiconductor memory device 2000 according to the second embodiment.

The FIG. 9 semiconductor memory device 2000 differs from the FIG. 1 semiconductor memory device 1000 in the further provision of an address converting circuit receiving and converting an address output from burst address counter 28 before the address is transmitted to column predecoder 14. The remainder of the configuration of semiconductor memory device 2000 is similar to that of semiconductor memory device 1000 and the description thereof will not be repeated.

Figure 10:
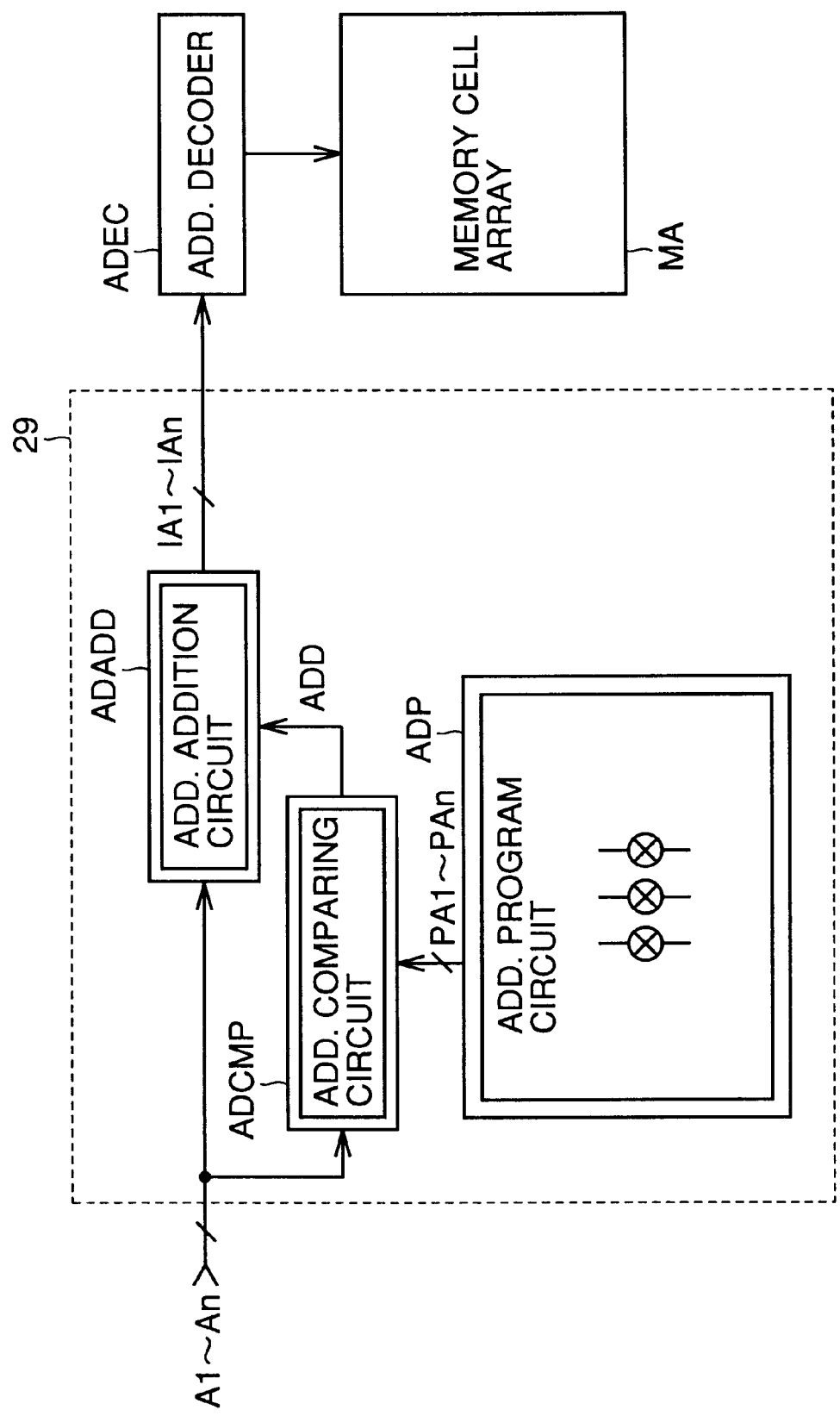
FIG. 10 is a block diagram showing a schematic configuration of the address conversion circuit 29 shown in FIG. 9.

FIG. 10 is a block diagram showing a schematic configuration of the address converting circuit 29 shown in FIG. 9.

Referring to FIG. 10, address converting circuit 29 receives address signal bits A1–An corresponding to an applied address signal and converting address signal bits A1–An into internal address signal bits IA1–IAn supplied to an address decoder ADEC. In response to internal address signal bits IA1–IAn supplied, address decoder ADEC selects a memory cell column in a memory cell array MA.

Address converting circuit 29 includes an address program circuit ADP in which an address corresponding to a defective memory cell to be repaired is set and from which defective address signal bits PA1–PAn corresponding to the address are output, an address comparing circuit ADCMP comparing address signal bits A1–An to defective address signal bits PA1–PAn to output a comparison-result signal ADD, and an address addition circuit performing an addition to address signal bits A1–An in response to comparison-result signal ADD. Address addition circuit ADADD outputs internal address signal bits IA1–IAn to the address decoder.

In this example, memory cell array MA is provided with an excessive column corresponding to a column address of "+1".

Such a configuration is applicable not only to column address substitution but row address substitution.

Figure 11:
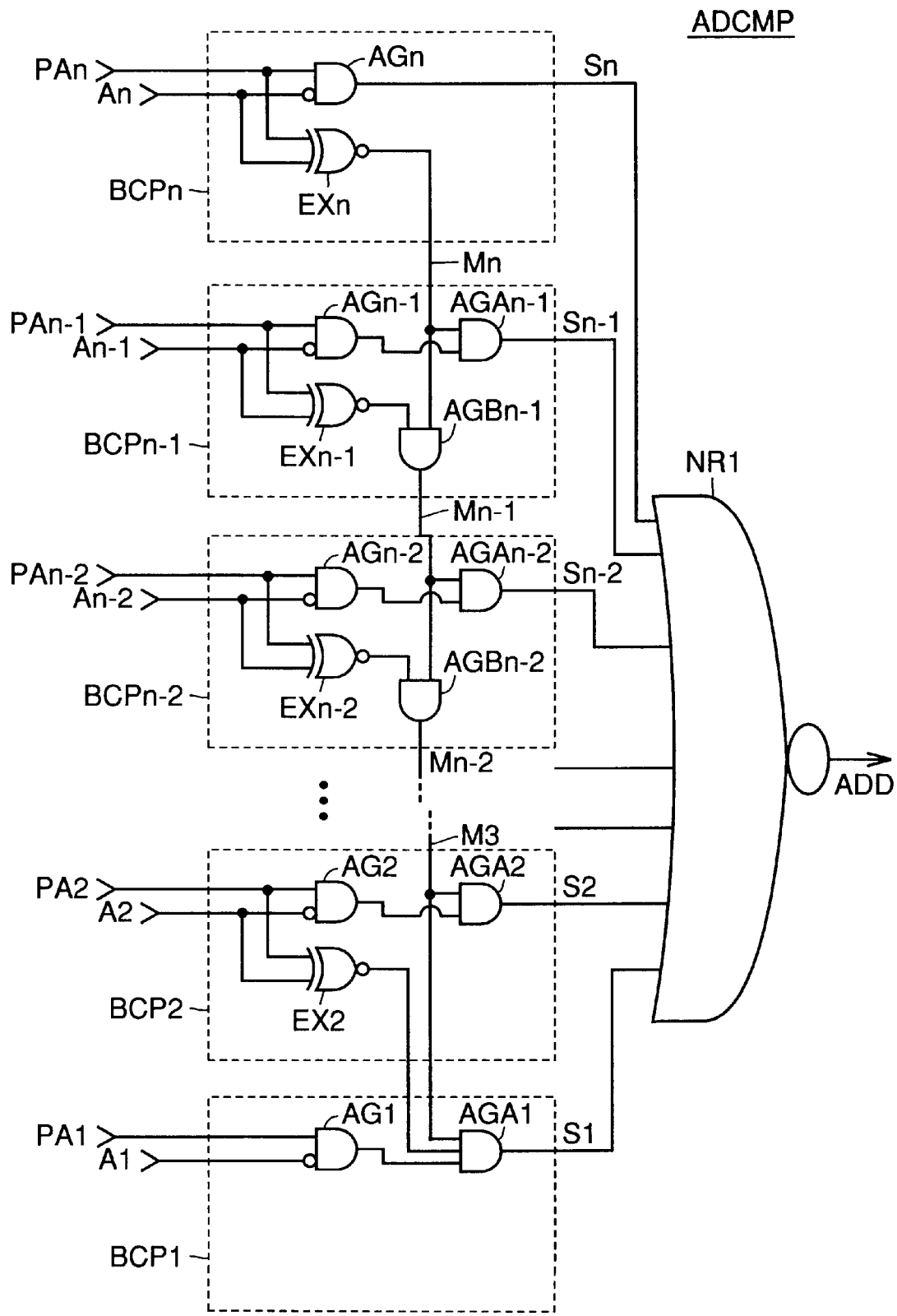
FIG. 11 is a circuit diagram showing a configuration of an address comparing circuit ADCMP.

FIG. 11 is a circuit diagram showing a configuration of an address comparing circuit ADCMP.

Referring to FIG. 11, address comparing circuit ADCMP includes bit comparing circuits BCP1–BCPn provided for input address signal bits A1–An, respectively, and outputting signals S1–Sn, and an NOR circuit NR1 receiving signals S1–Sn and outputting an NOR thereof. The output from NOR circuit NR1 serves as an addition instructing signal ADD instructing that one should be added to an address signal.

Bit comparing circuit BCPn includes a gate circuit AGn and an EXNOR circuit EXn each receiving an address signal bit An and a defective address signal bit PAn. When address signal bit An is low and defective address signal bit PAn is high, gate circuit AGn provides a high-level signal as signal Sn. EXNOR circuit EXn outputs a high-level signal as a match signal Mn when address signal bit An matches defective address signal bit PAn.

Bit comparing circuit BCPi includes a gate circuit AGi and an EXNOR circuit EXi each receiving an address signal bit Ai and a defective address signal bit PAi, an AND circuit AGAi receiving an output from gate circuit AGi and a match signal Mi+1 and outputting a signal Si, and an AND circuit AGBi receiving an output form EXNOR circuit EXi and match signal Mi+1 and outputting a match signal Mi. Gate circuit AGi outputs a high-level signal when address signal bit Ai is low and defective address signal bit PAi is high. EXNOR circuit Exi outputs a high-level signal as match signal Mi when address signal bit Ai matches defective address signal bit PAi, wherein i represents a natural number from three to (n−1).

Bit comparing circuit BCP2 includes a gate circuit AG2 and an EXNOR circuit EX2 each receiving address signal bit A2 and defective address signal bit PA2, and an AND circuit AGA2 receiving an output form gate circuit AG2 and a match signal M3 and outputting signal S2. Gate circuit AG2 outputs a high-level signal when address signal bit A2 is low and defective address signal bit PA2 is high. EXNOR circuit EX2 outputs a high-level signal as match signal M2 when address signal bit A2 matches defective address signal bit PA2.

Bit comparing circuit BCP1 includes a gate circuit AG1 receiving address signal bit A1 and defective address signal bit PA1, and a 3-input AND circuit AGA1 receiving an output from gate circuit AG1 and match signals M2 and M3 and outputting signal S1. Gate circuit AGi outputs a high-level signal when address signal bit A1 is low and defective address signal bit PA1 is high.

Simply describing the operation, match signal Mi goes high and renders gate circuit AGAi effective when the address signal bits upper than an ith bit all match, and signal. Si also goes high when PAi is larger than Ai (i.e., PAi is high and Ai is low) in the ith address signal bit. In other words, any of signals S1–Sn that goes high means that defective address PAn–PA1>input address An–A1.

Thus, addition instructing signal ADD output from NOR circuit NR1 and corresponding to an NOR of signals S1–Sn goes high when set address PAn–PA1≦input address An–A1. When addition instructing signal ADD goes high, the address addition circuit described hereinafter adds one to input address A1–An.

Figure 12:
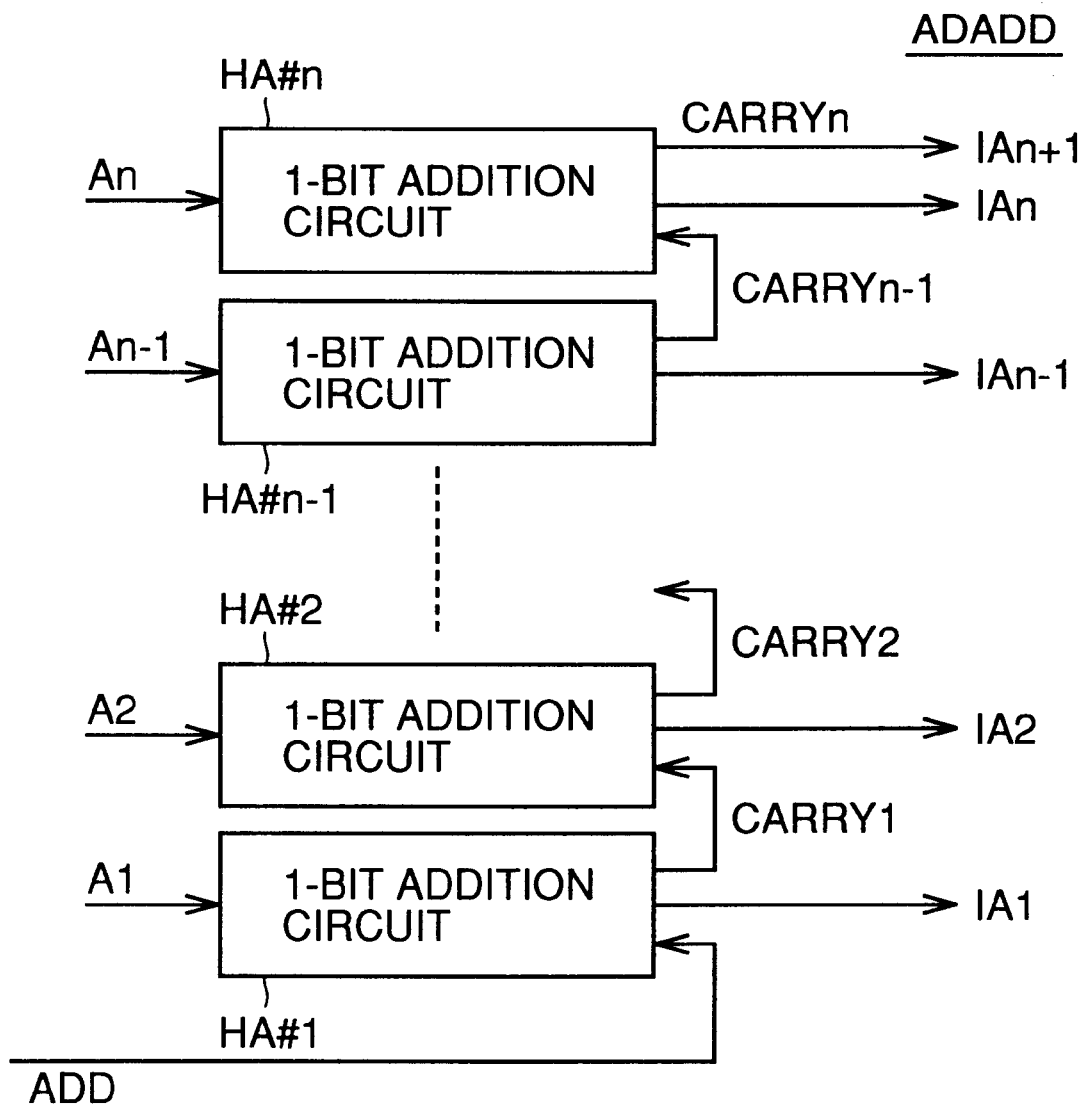
FIG. 12 is a circuit diagram showing a configuration of the address addition circuit ADADD shown in FIG. 10.

FIG. 12 is a circuit diagram showing a configuration of the address addition circuit ADADD shown in FIG. 10.

Referring to FIG. 12, address addition circuit ADADD includes a 1-bit addition circuit HA#1 receiving an addition instructing signal ADD activated when 1 is added to an input address and the least significant bit of an address signal, and a 1-bit addition circuit HAi receiving a carry signal CARRYi output from 1-bit addition circuit HA#i and an ith bit Ai of an address to perform an adding operation, wherein i is two to n.

1-bit addition circuits HA#1–HA#n output converted, internal address signal bits IA1–IAn, respectively. Carry signal CARRYn output from 1-bit addition circuit HA#n serves as an internal address signal bit IAn+1.

Referring again to FIG. 10, address converting operation of the semiconductor memory device according to the second embodiment will now be described.

Initially, if input address A1–An is smaller than defective address PA1–PAn to be substituted, i.e., A1 to An<PA1 to PAn, addition instructing signal ADD is held low and input address A1–An is transparently transmitted as internal address IA1–IAn to an internal address system and column access is performed.

If input address A1–An is equal to or larger than defective address PA1–PAn to be substituted, i.e., A1 to An≧PA1 to PAn, addition instructing signal ADD is held high and input address A1–An plus 1 is transmitted as internal address IA1–IAn to the internal address system and column access is performed. Thus, an operation is performed without changing an order of data buses while avoiding the defect.

With the configuration described above, column substitution can be achieved without switching an order of data buses, and chip area can be prevented from increasing and rapid operation can also be achieved.

Third Embodiment

The configuration having such a multibit data bus as described with reference to the first embodiment can be that which uses a large number of sense amplifier blocks or row blocks RB#0–RB#m with a global data bus extending across them as separate banks. A DRAM of such a multibank configuration with flexible row redundancy applied thereto will now be considered.

Figures 13, 14:
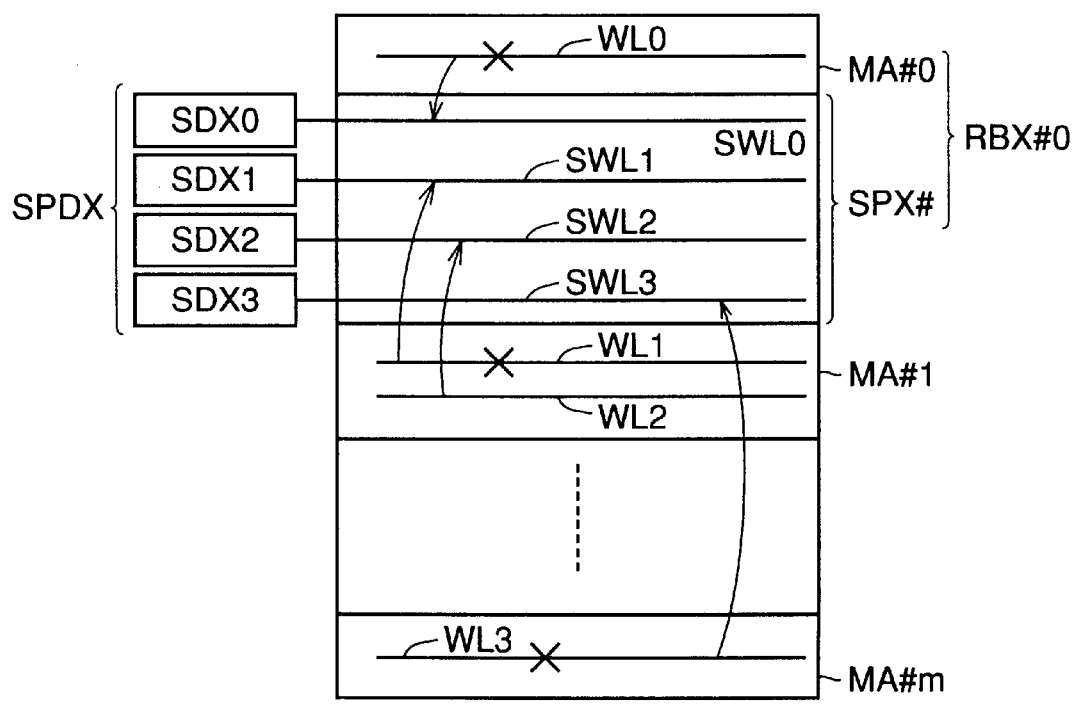
FIG. 13 is a conceptual view for representing flexible row redundancy in a DRAM having a multibank configuration.
FIG. 14 schematically shows a configuration of the spare row decoder circuit SPDX shown in FIG. 13.

FIG. 13 is a conceptual view for illustrating flexible row redundancy in a DRAM of a multibank configuration.

Referring to FIG. 13, the memory array is divided into a plurality of banks RBX#0–RBX#m arranged in the column direction and formed of normal memory subarrays MA#1–MA#m, respectively, each having normal memory cells arranged in rows and columns.

Bank RBX#0 includes a normal memory subarray MA#0 having normal memory cells arranged in rows and columns, and a spare array SPX# having spare memory cells arranged in a plurality of rows and sharing columns with normal memory subarray MA#0.

The plurality of spare rows (or spare word lines) included in spare array SPX# can substitute for any defective normal word line of normal memory subarrays MA#0–MA#m. Normal memory subarrays MA#0–MA#m are provided with row decoders X0–Xn, respectively, and spare array SPX# is provided with a spare row decode circuit SPDX.

In the configuration shown in FIG. 9, spare array SPX# are shared by normal memory subarrays MA#0–MA#m. Thus, if there are defective rows intensively in a single normal memory subarray, spare word lines in spare array SPX# can be used to substitute for and thus repair the defective rows so as to enhance product yield. A spare row decoder can also be shared by a plurality of normal memory subarrays (or row blocks) to reduce the number of spare decoders.

FIG. 14 schematically shows a configuration of the spare row decoder circuit SPDX shown in FIG. 13.

FIG. 14 exemplifies a configuration of spare row decode circuit SPDX in spare array SPX# with four spare word lines SWL0–SWL3 provided. Spare row decode circuit SPDX includes row spare decoders SDX0–SDX3 provided for spare word lines SWL0–SWL3, respectively. In each of spare row decoders SDX0–SDX3 are programmed both a block address (or bank address) specifying a memory subarray and a row address of the subarray.

Let us now consider substituting defective normal word lines WL0, WL1 and WL2, and WL3 respectively included in normal memory subarrays MA#0, MA#1, and MA#m with spare word lines, as shown in FIG. 14.

In this example, the address (including the block address, i.e., the bank address) of word line WL0 is programmed in spare row decoder SDX0, the addresses of defective normal word lines WL1 and WL2 are programmed in spare row decoders SDX1 and SDX2, respectively, and the address of defective normal word line WL3 is programmed in spare row decoder SDX3.

Thus, defective normal word lines WL0, WL1, WL2, and WL3 are substituted by spare word lines SWL0, SWL1, SWL2, and SWL3, respectively.

Since a spare row decoder is shared by normal memory subarrays MA#0–MA#m, it is not necessary to provide a spare row decoder to each respective normal memory subarray and array occupied area can be prevented from increasing.

The spare word lines shared by normal memory subarrays MA#0–MA#m can be improved in utilization efficiency. Furthermore, spare array SPX# provided in row block RBX#0 and shared by normal memory subarrays MA#0–MA#m allows spare word line SWL included in spare array SPX# to be used by any normal memory subarray and thus improved in utilization efficiency.

Furthermore, if spare array SPX# and normal memory subarray MA#0 share a sense amplifier, a configuration in which a sense amplifier provided for row block RBX#0 is activated when one of spare decoders SDX0–SDX3 is selected can be used to simplify sense amplifier control operation.

The configuration described above, however, results in a relation of "to repair" and "to be repaired" across banks.

Figure 15:
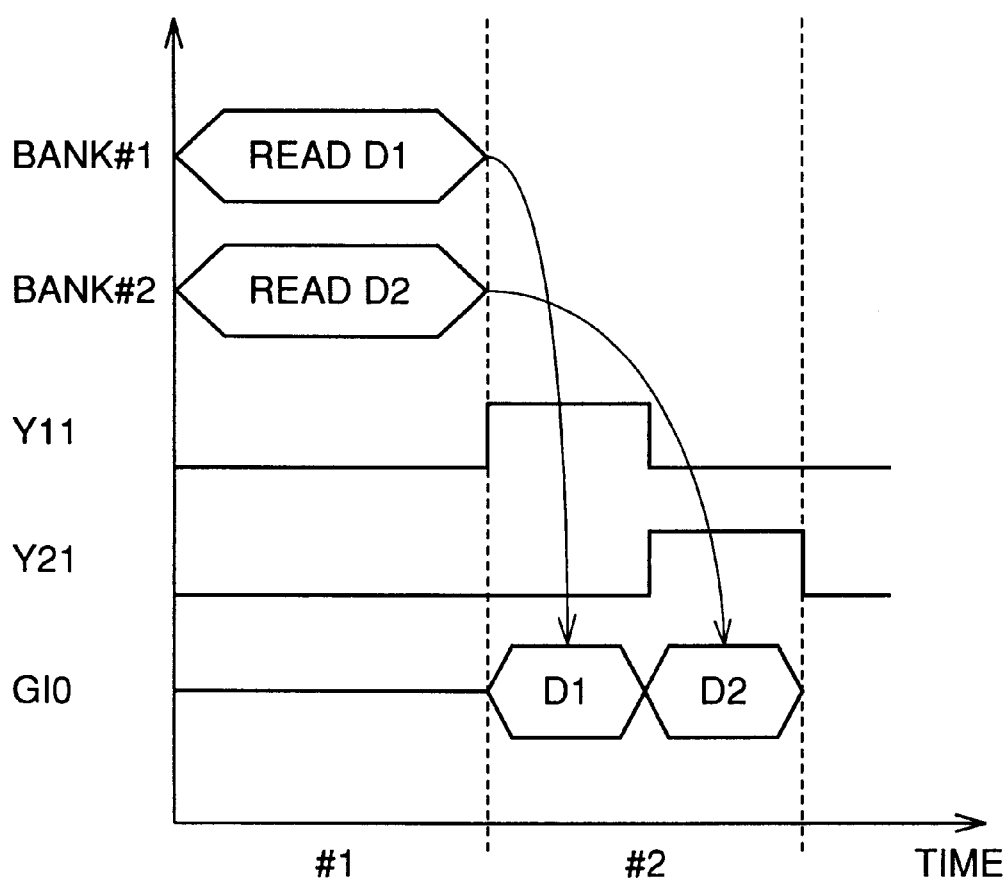
FIG. 15 is a waveform diagram for representing a bank access conflict.

FIG. 15 is a waveform diagram for representing a bank access conflict.

To simplify the description, a 2-bank configuration is exemplified.

In each bank typically data are read in parallel to achieve faster memory access. Data from each bank can be interleaved and thus read out at an output terminal to allow the read operation provided by the entirety of a semiconductor memory device to be faster than the read cycle time of each bank.

For example, as shown in FIG. 15, data of banks 1 and 2 must be read during a same clock cycle.

If in this example a defective row of bank 2 is substituted by a spare row of bank 1, in clock cycle #1 shown in the figure a regular row of bank 1 and a spare row of bank 1 should be read in parallel.

Figure 16:
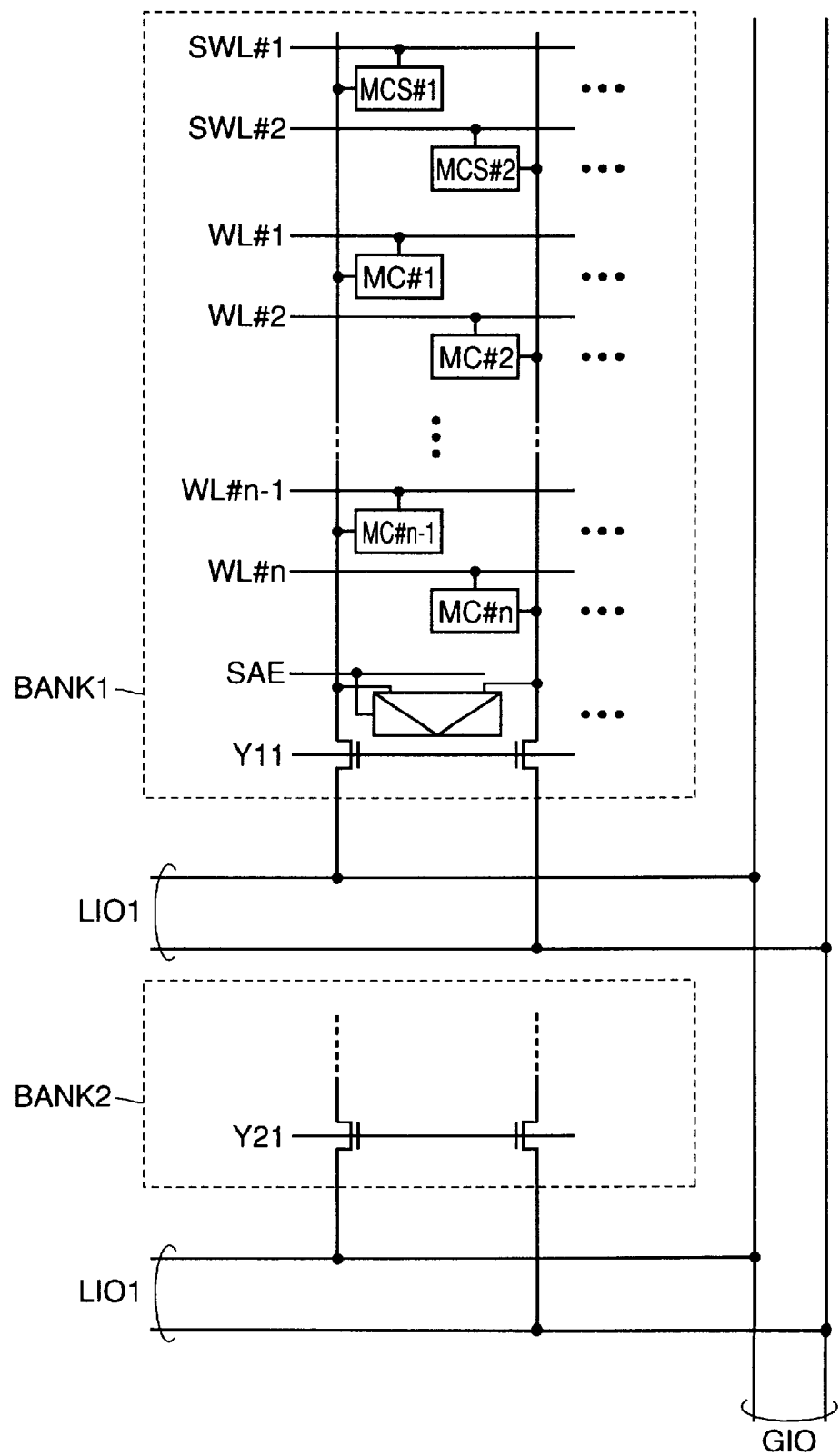
FIG. 16 is a circuit diagram for illustrating an access conflict.

FIG. 16 is a circuit diagram for illustrating an access conflict.

Referring to FIGS. 15 and 16, access conflict will now be described. In bank 1, a bit line and a sense amplifier are shared by each row. More specifically, when an access conflict occurs, a regular row of bank 1 and a spare row of bank 1 conflict with respect to the time in which a bit line is used and the time in which a sense amplifier is used and the rows can thus not be read out in parallel. (In FIG. 16, the data stored in memory cell MC#1 and the data stored in spare memory cell MCS#1 can not be read simultaneously.) Thus, they can not be read successively during clock cycle #2.

A configuration allowing data to the output on a global data bus when an access conflict occurs between banks 1 and 2, will now be described. The problem of access conflict can be overcome if a cache memory row saving the information of a spare row of bank 1 shares the global data bus with bank 1 and the cache memory row (or cache register) is also adapted to be operable independently of bank 1.

Figure 17:
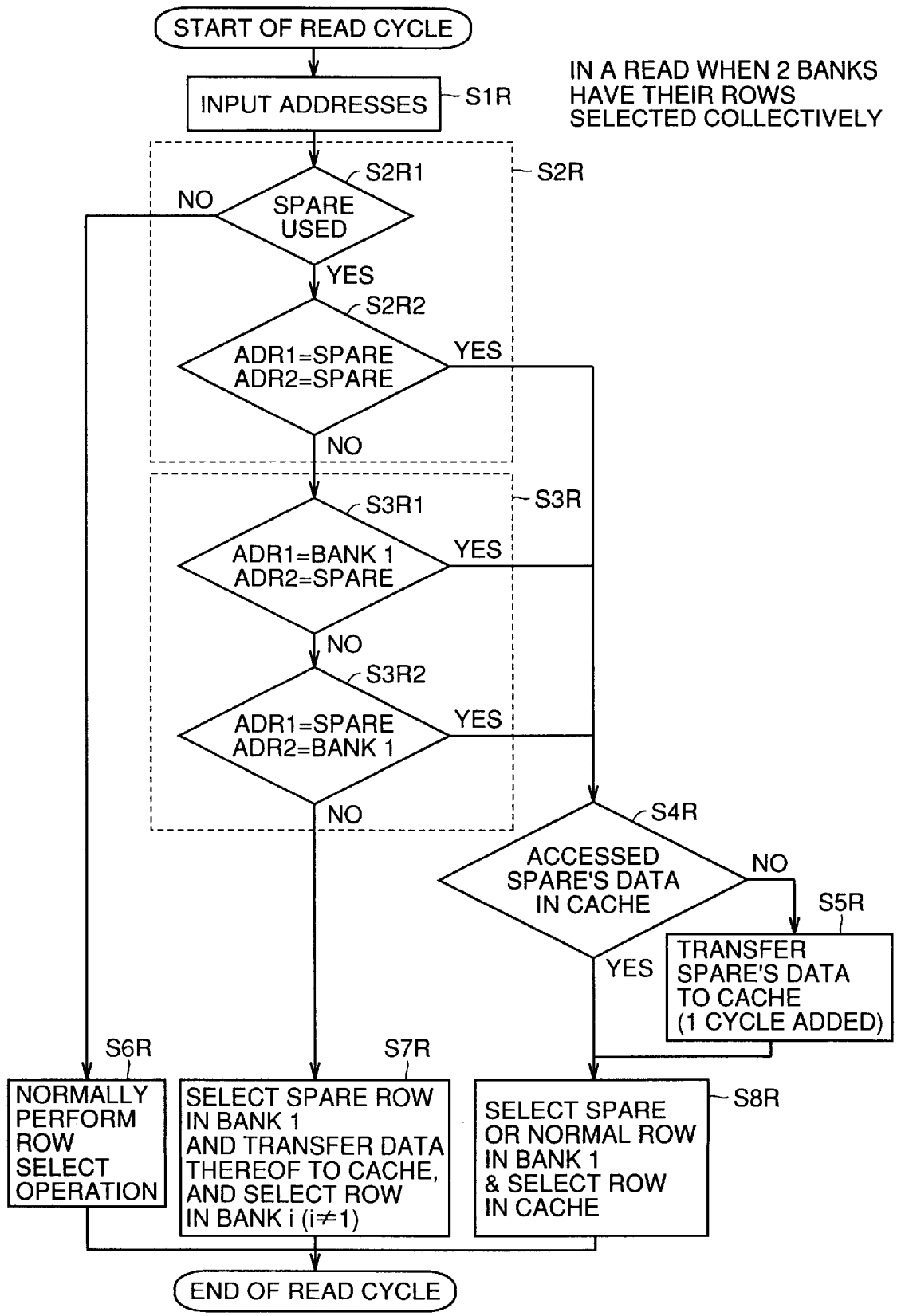
FIG. 17 is a flow chart presenting a flow of row selection in read operation that is applied in a semiconductor memory device according to a third embodiment of the present invention.

FIG. 17 is a flow chart when a row is selected in a read in a semiconductor memory device according to the third embodiment.

It is assumed herein that bank 1 is initially accessed and bank 2 is then accessed.

Referring to FIG. 17, when a read cycle starts, initially addresses ADR1 and ADR2 read at step S1R are input.

At step S2R, determination is made as to whether a spare row arranged in bank 1 is used.

In step S2R, determination is initially made at substep S2R1 as to whether a spare row is used. If a spare row is not being used, the process jumps to step S6R and a row select operation is normally performed. Then a column is accessed to externally read data and the next cycle then starts.

If a spare row has been selected, determination is made at substep S2R2 as to whether the first accessed address ADR1 corresponds to a spare row and the second accessed address ADR2 also corresponds to a spare row. If the two accessed addresses are both correspond to spare rows, the process branches to step S4R. If not, either accessed address ADR1 or ADR2 is assumed to be a spare row and the process goes to step S3R.

At step S3R, determination is made as to whether either one of the accessed addresses is the address of bank 1. Initially, at substep S3R1, determination is made as to whether address ADR firstly accessed is the address of bank 1 and address ADR2 secondly accessed also corresponds to a spare row. Then, at substep S3R2, determination is made as to whether accessed address ADR1 corresponds to a spare row and accessed address ADR2 is also the address of bank 1.

When the determinations at substeps S3R1 and S3R2 are both negative, the process goes to step S7R. In this case, while a spare arranged in bank 1 is being used, another bank having a row selected in parallel is not bank 1. Thus, access conflict does not occur. Thus, at step S7R, a spare row in bank 1 is selected, and associated with the selection of the spare row the data of the spare row is transferred to a cache in preparation for being read out. In parallel, a row is selected in the bank other than bank 1 and a column is then accessed to read data externally, and the next cycle then starts.

If any of the determinations at substeps S2R2, S3R1, S3R2 is positive, it is assumed that an access conflict occurs and the process goes to step S4R.

At step S4R, determination is made as to whether the data of a spare accessed exists in a cache. If not, the data of the two accessed addresses can not be subjected to parallel row selection. Thus the process goes to step S5R and the data of the spare is transferred to the cache. In this case, read time takes one extra cycle. Then the process goes to step S8R.

If the data exists in the cache at step S4R, the process goes directly to step S8R. Since one of data to be read exists in a cache row, bank 1's spare row or normal row and the cache's row are selected in parallel at step S8R. Then a column is accessed to read data and the next cycle starts.

Figure 18:
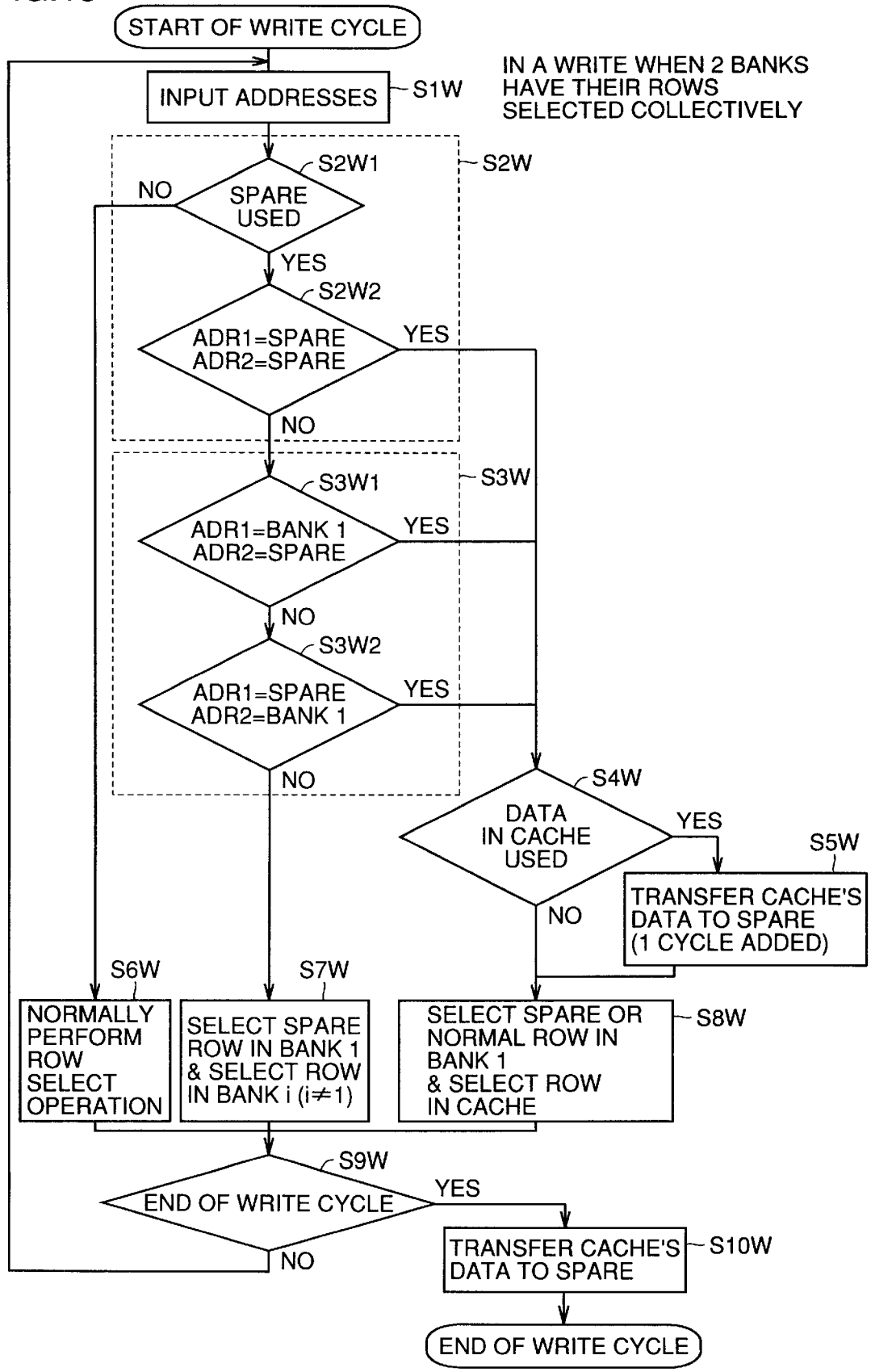
FIG. 18 is a flow chart for presenting a process in write operation when two banks have their rows selected collectively.

FIG. 18 is a flow chart for presenting a process in a write when two banks have their rows selected collectively.

Referring to FIG. 18, when a write cycle starts, initially at step S1W addresses are input. Then determination is made at step S2W as to whether a spare row is being used.

In step S2W, initially at substep S2W1 determination is made as to whether a spare row is being used. If a spare row is not being used, the process goes to step S6W and a row select operation is performed normally. If a spare is being used, the process goes to step S2W2 to determine whether the accessed two addresses both correspond to spares. If step S2W2 provides a negative determination, the process goes to step S3W.

At step S3W, determination is made as to whether either one of the accessed addresses corresponds to bank 1. In step S3W, initially at substep S3W3 determination is made as to whether address ADR1 firstly accessed is the address of bank 1 and address ADR2 secondly accessed also corresponds to a spare row. If S3W1 step provides a negative determination, the process goes to substep S3W2.

At substep S3W2, determination is made as to whether address ADR1 corresponds to a spare row and address ADR2 is also the address of bank 1. If substep S3W2 provides a negative determination, the process goes to step S7W.

At step S7W, a row of the bank other than bank 1 is selected to write data in parallel with selecting a spare row in bank 1, since any conflictive relation does not occur.

If any of the determinations at substeps S2W2, S3W1, S3W2 is positive, the process goes to step S4W.

The process goes to step S4W when an access conflict occurs. At step S4W, determination is made as to whether that cache row provided for each bank which corresponds to a bank being accessed has data. If it has data, the data should be stored and the process thus goes to step S5W to transfer the data of the cache to a spare row in bank 1. In this case, write operation requires more time than normal write operation by one cycle. Then the process goes to step S8W.

If it has been determined at step S4W that there is not data in a cache row corresponding to an accessed bank the process goes to step S8W, since data may be written directly in the cache row.

At step S8W, a spare or normal row in bank 1 and a row in the cache are selected in parallel to perform write operation. When steps S6W, S7W, S8W each complete, the process goes to step S9W. In this step, determination is made as to whether after a write cycle ends a subsequent operation (e.g., a read operation) is to be started. If another write cycle is successively provided, the process goes to step S1W and waits for an address to be input.

When a write cycle ends and shifts to a different operation, the process goes to step S10W to save the data of the cache used in the write into a spare row of bank 1 and the process then goes to the next cycle.

The series of operations described above can eliminate the problem of access conflict and flexible redundancy can be achieved even in multibit configurations without difficulties.

Figure 19:
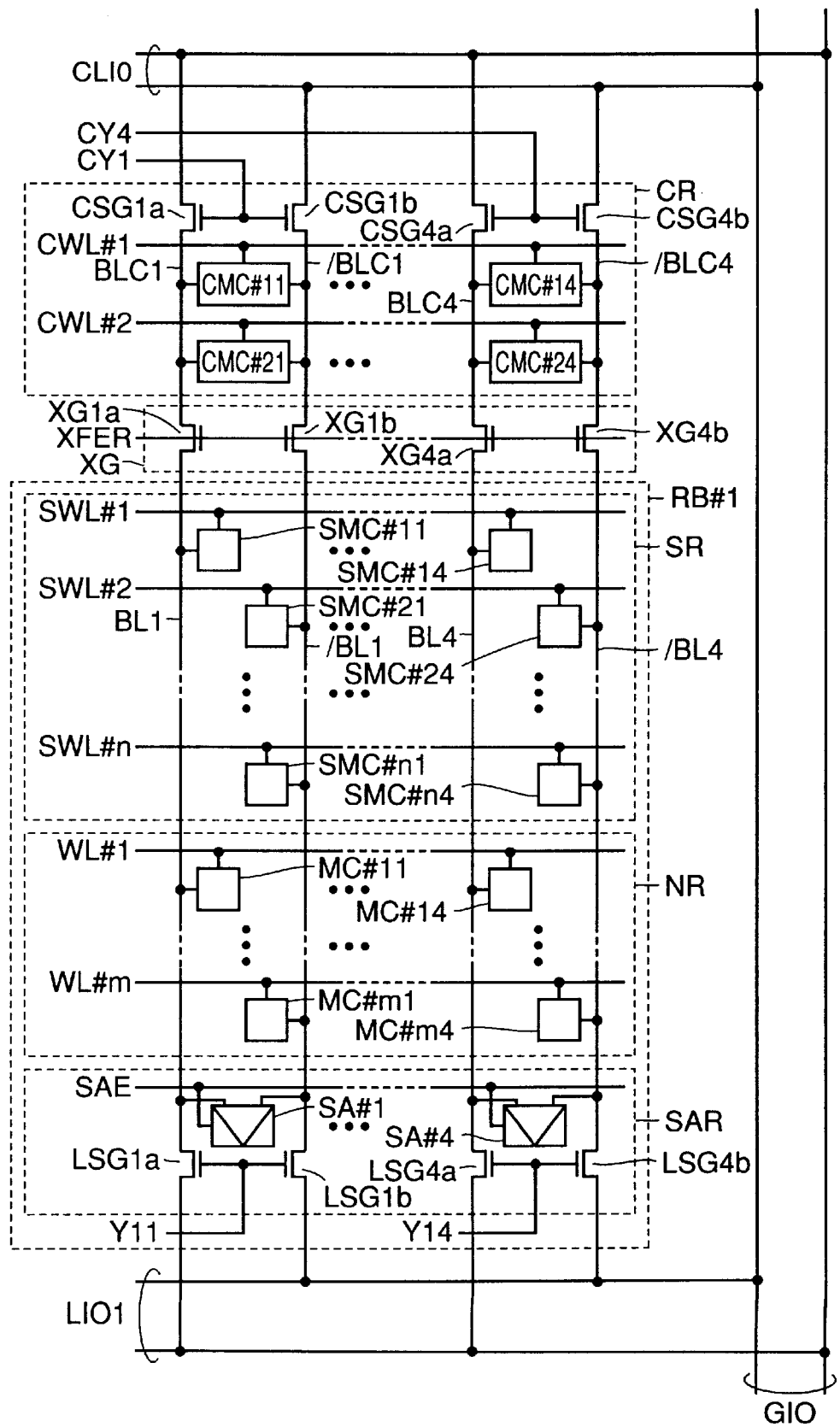
FIG. 19 is a circuit diagram for illustrating a connection between a cache row and bank 1 in the semiconductor memory device according to the third embodiment.

FIG. 19 is a circuit diagram for representing a connection between a cache row and bank 1 in the semiconductor memory device according to the third embodiment.

Referring to FIG. 19, in the semiconductor memory device according to the third embodiment, a row block RB#1 operating as bank 1 and a cache row block CR arranged adjacent to each other are provided respectively with a local data bus LIO1 and a local data bus CLIO which share a global data bus GIO. Each bit line of cache row block CR and a bit line associated therewith in bank 1 are connected together via a transfer circuit XG.

Row block RB#1 includes a spare row block SR provided with a spare row, a normal row block NR provided with a normal row, and a sense amplifier portion SAR shared by spare and normal row blocks SR and NR. Spare and normal row blocks SR and NR and sense amplifier portion SAR share bit lines BL1–BL4 and /BL1–/BL4. While FIG. 19 shows four bit line pairs to simplify the description, more bit lines are actually provided in each block.

Normal row block NR includes word lines WL#1–WL#m, and a memory cell MC#ij provided corresponding to an intersection of a word line WL#i and a bit line WLj and a memory cell MC#ij provided corresponding to an intersection of word line WL1#i and a bit line /BLj, wherein m represents a natural number, and i represents an odd number of no more than m and j is one to four.

Sense amplifier portion SAR includes a sense amplifier SA#i activated by a sense amplifier activation signal SAE to amplify a potential difference between bit lines BLi and /BLi, and a column select gate LSGia activated by a column select signal Y1i to connect bit line BLi and local data bus LIO1 together and a column select gate LSGib activated by column select signal Y1i to connect bit line /BLi and local data bus LIO1 together, wherein i is one to four.

Spare block SR includes word lines WL#1–WL#n, and a spare memory cell SMC#ij provided corresponding to an intersection of a word line SWL#i and bit line WLj and a spare memory cell SMC#ij provided corresponding to an intersection of word line SWL#i and bit line /BLj, wherein n represents a natural number, and i represents an odd number of no more than n and j is one to four.

Cache block CR includes word lines CWL#1 and CWL#2, a cache memory cell CMC#ij provided corresponding to an intersection of word line CWL#i and bit lines WLjJ and /WLj (wherein i is one to two and j is one to four), and a column select gate CSGia activated by a column select signal CYi to connect bit line BLi and local data bus CLIO together (wherein i is one to four) and a column select gate CSGib activated by column select signal CYi to connect bit line /BLi and local data bus CLIO together (wherein i is one to four). It should be noted that while the cache memory cell herein is an SRAM memory cell, it may be a DRAM memory cell.

Transfer circuit XG includes a transfer gate XGia connecting bit line BLCi and bit line BLi together in response to a transfer signal XFER, and a transfer gate XGib connecting bit line /BLCi and bit line /BLi together in response to transfer signal XFER, wherein i is one to four.

Figure 20:
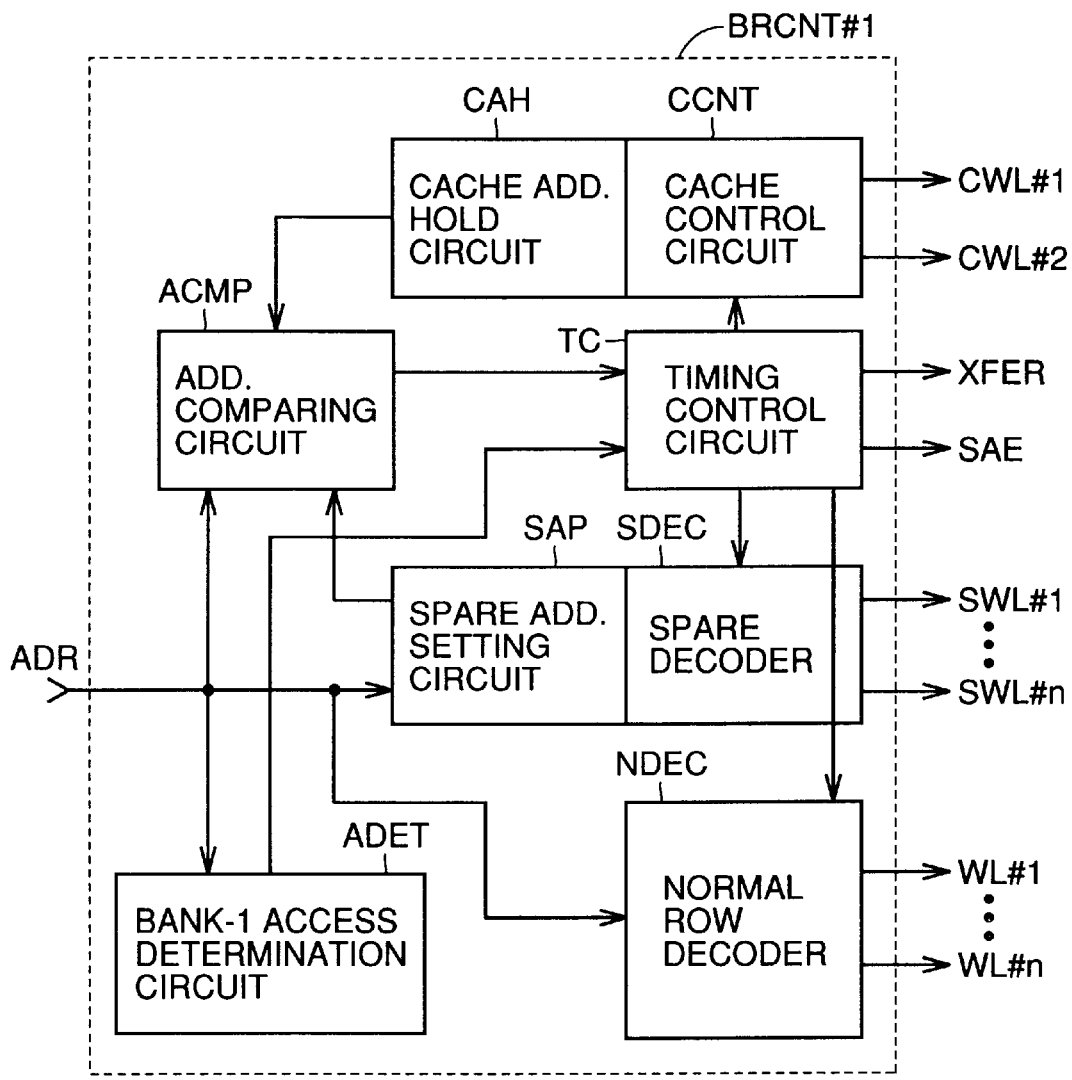
FIG. 20 is a block diagram of a bank row control circuit BRCNT#1 controlling a row system provided for the bank 1 and cache block of the third embodiment.

FIG. 20 is a block diagram of a bank row control circuit BRCNT#1 controlling a row system provided for a bank 1 and a cache block in the third embodiment.

Bank row control circuit BRCNT#1 includes a spare address setting circuit SAP setting a defective address corresponding to a spare row as a spare address, and a cache address hold circuit holding an address of data currently held in a cache row.

The row-related circuit also includes an address comparing circuit ACMP receiving and comparing accessed address ADR to a cache address, a spare address and the like, a bank 1 access determination circuit ADET determining whether accessed address ADR is the address corresponding to bank 1, and a timing control circuit TC receiving an output form address comparing circuit ACMP and an output from bank 1 access determination circuit ADET, and controlling a timing and also outputting transfer signal XFER and sense amplifier activation signal SAE.

For bank 1, the row-related circuit also includes a spare decoder SDEC activating spare word lines SW#1–SW1#n according to an indication from the timing controller, a normal row decoder NDEC activating word lines WL#1–WL#n according to accessed address ADR and an output from timing control circuit TC, and a cache control circuit CCNT activating word lines CWL#1, CWL#2 of a cache row according to an indication from timing control circuit TC.

While FIGS. 19 and 20 correspond to a 2-bank configuration, providing two cache rows for each bank, to simplify the figures, practically for an N-bank configuration a cache block is provided with N cache rows.

Figure 21:
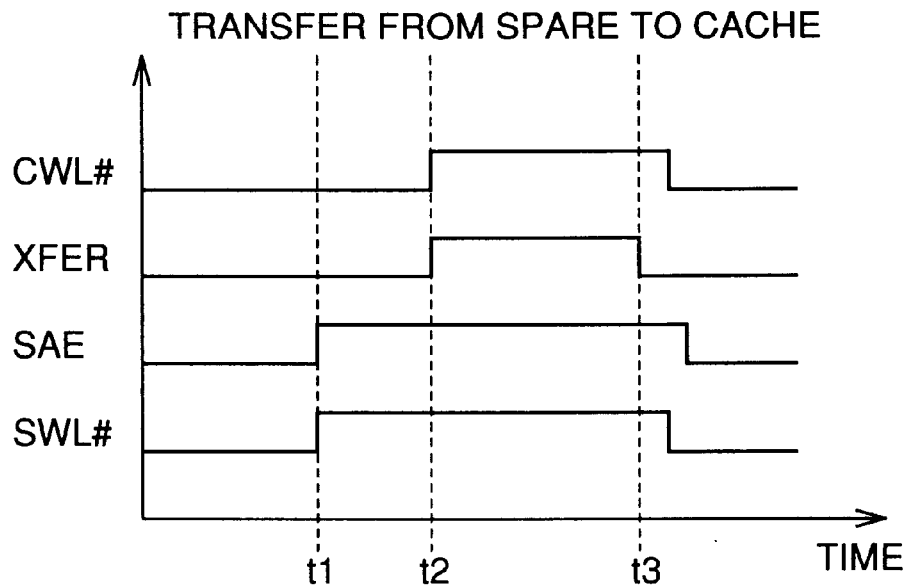
FIG. 21 is a waveform diagram of operation for illustrating a timing of transmission from a spare row to a cache row.

FIG. 21 is a waveform diagram of operation for representing a timing of transfer from a spare row to a cache row.

Referring to FIG. 21, at time t1, spare word line SW# and sense amplifier activation signal SAE are activated. Responsively, onto a bit line associated therewith is read out and amplified the data stored in a spare row.

At time t2, transfer signal XFER and cache word line CWL# are activated. Responsively the data read on the bit line is written into a cache row. At time t3, the transfer signal is inactivated, the cache row and the spare row are disconnected, and the cache and spare rows have their respective word lines falling to complete the transfer from the spare row to the cache row.

Figure 22:
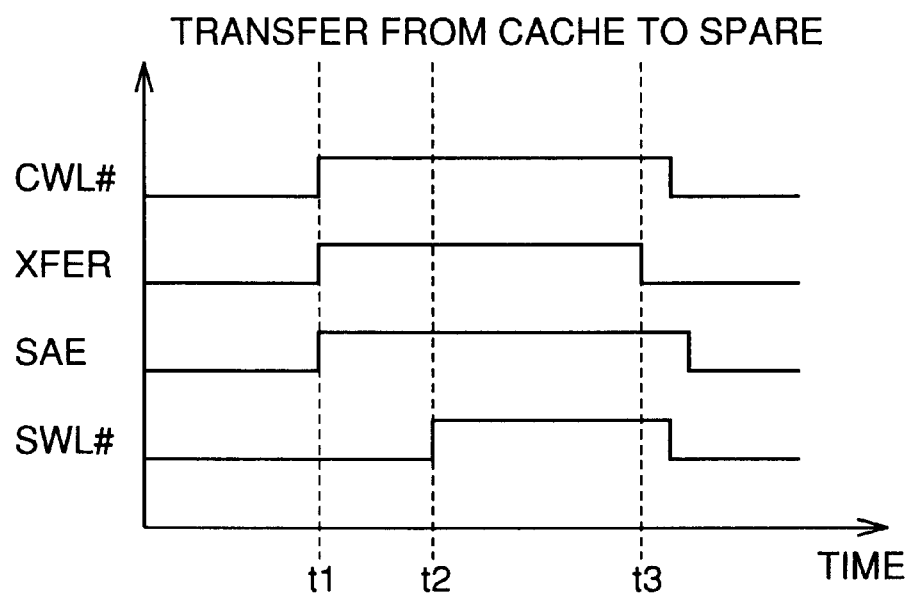
FIG. 22 is a waveform diagram of operation for illustrating a timing of data transfer from a cache row to a spare row.

FIG. 22 is a waveform diagram of operation for representing a timing at which data is transferred from a cache row to a spare row.

Referring to FIG. 22, at time t1 are activated word line CWL# of a cache row, transfer signal XFER and sense amplifier activation signal SAE, while data held in the cache row is read onto a bit line and thus amplified.

At time t2, spare word line SWL# is activated and the data is written from the bit line to a spare row. At time t3, transfer signal XFER transitions falls and the cache and spare rows then have their respective word lines going low to complete the data transfer from the cache row to the spare row.

With such a controlling timing, in a transfer operation a sense amplifier can be used to amplify both data of a normal row and data of a cache row.

Furthermore, the arrangement of the cache, spare and normal blocks shown in FIG. 19 can be varied.

Figure 23:
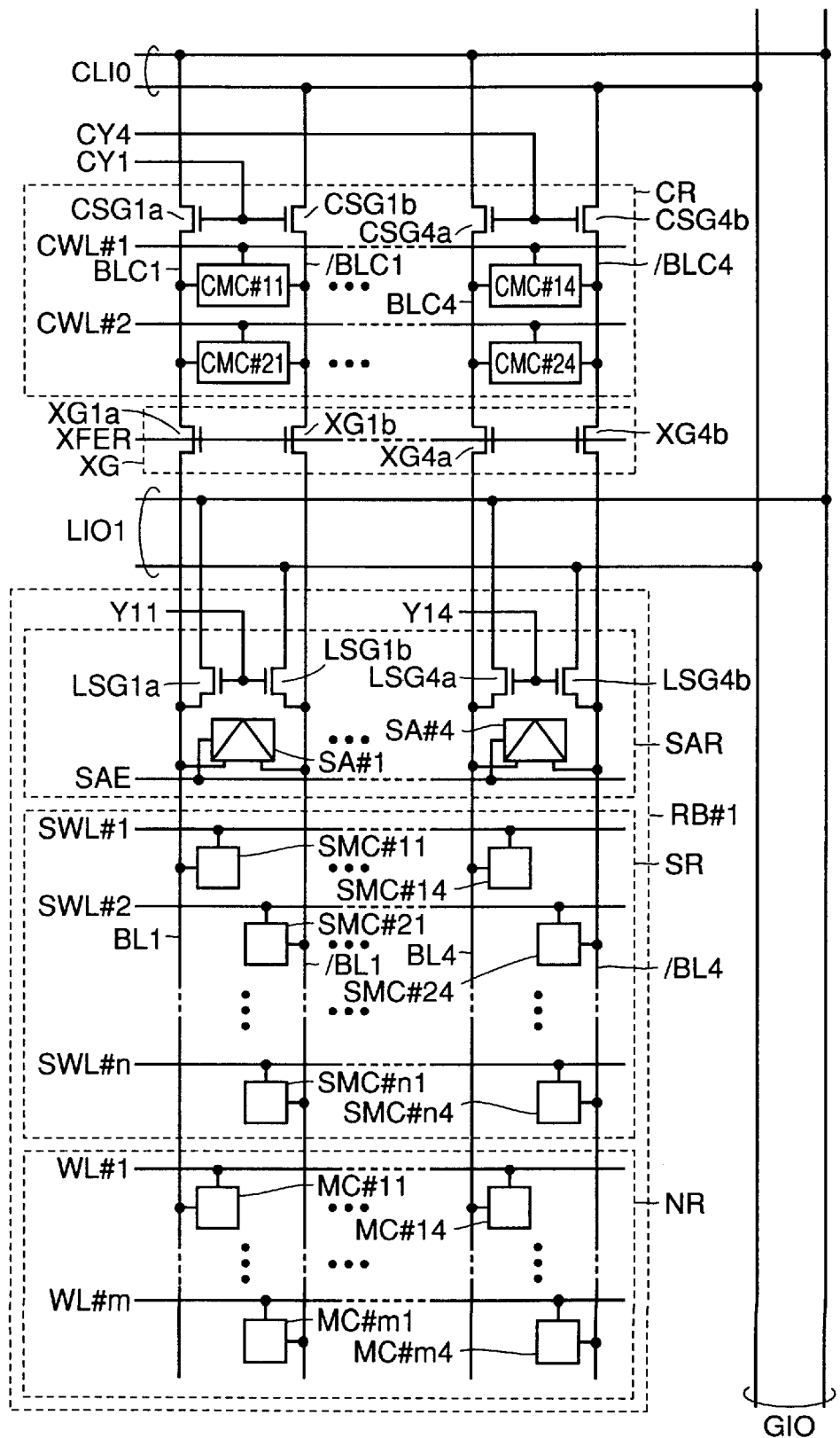
FIG. 23 is a view for illustrating a first variation of a cache row and bank 1 in arrangement in the semiconductor memory device according to the third embodiment.

FIG. 23 is a view for illustrating a first variation in arranging a cache row and bank 1 in the semiconductor memory device according to the third embodiment.

The first variation shown in FIG. 23 is different from the arrangement shown in FIG. 19 in that the sense amplifier portion SAR, spare column block SR and normal row block NR provided in row block RB#1 operating as bank 1 are arranged successively from that side of row block RB#1 which is adjacent to cache row block CR.

Cache row block CR, sense amplifier portion SAR, spare column block SR and normal row block NR are similar in configuration to those shown in FIG. 19 and the description thereof will thus not be repeated.

Figure 24:
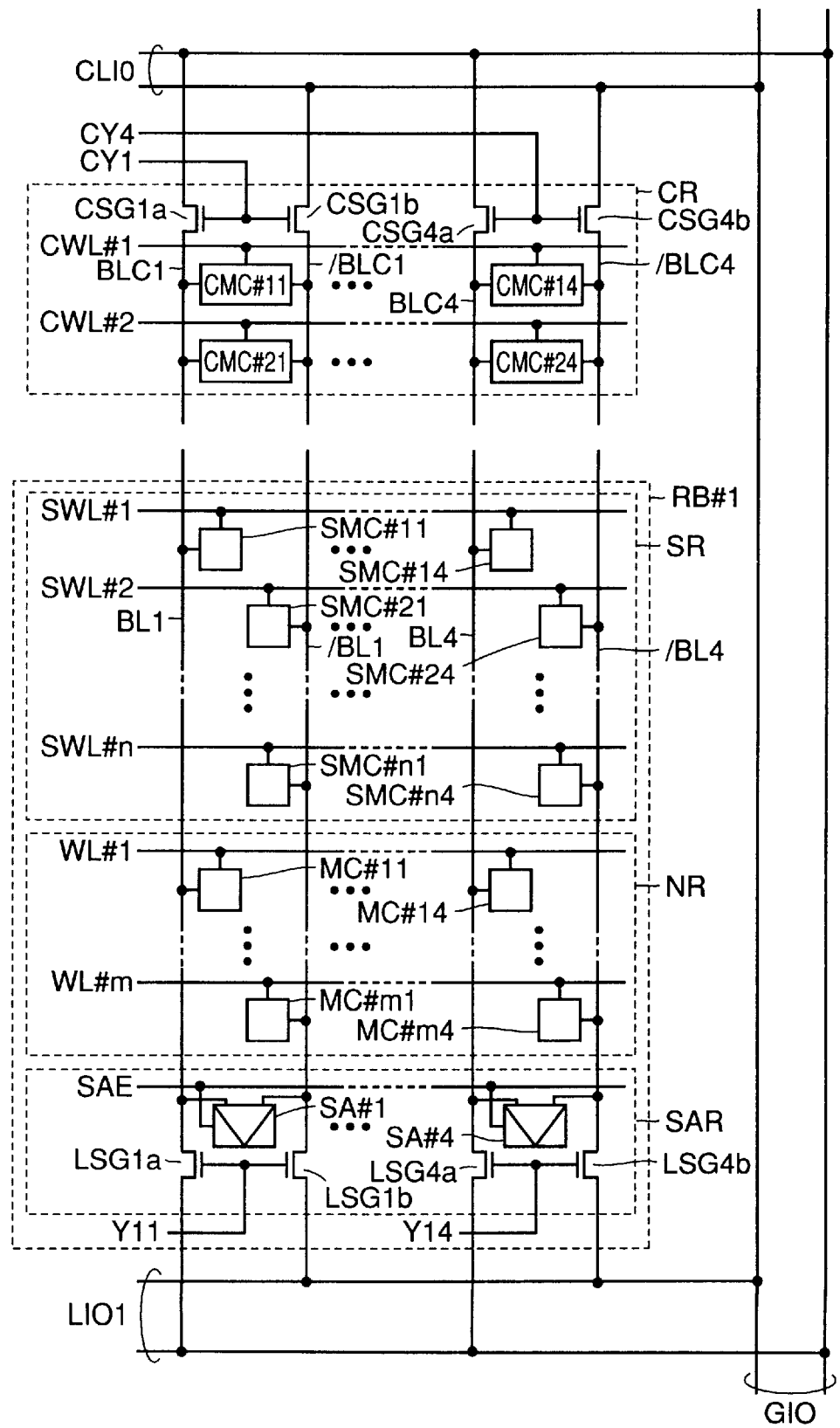
FIG. 24 is a view for illustrating a second variation of a cache row and bank 1 in arrangement in the semiconductor memory device according to the third embodiment.
Figure 25:
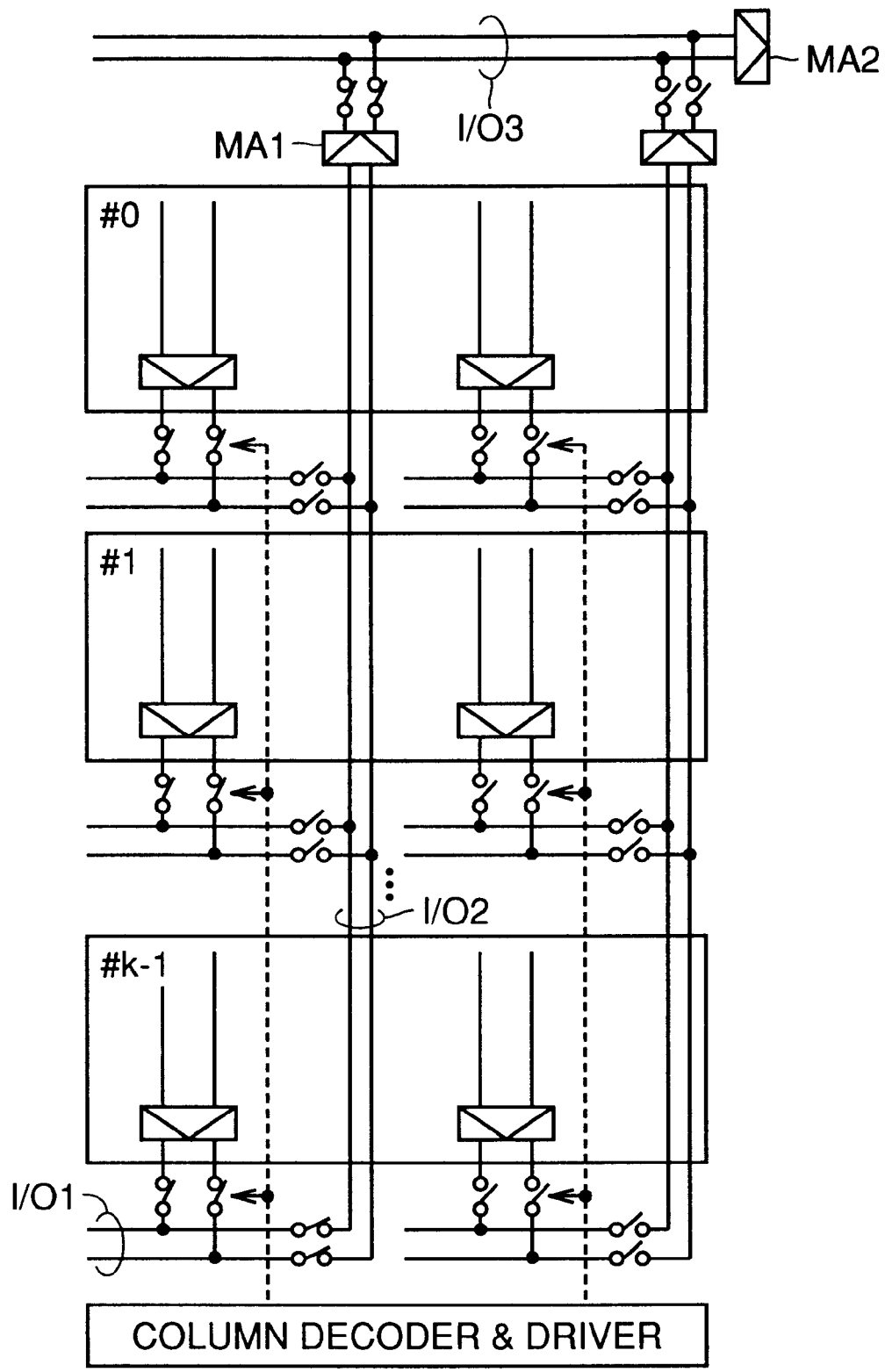
FIG. 25 is a conceptual view showing a hierarchical data bus configuration.
Figure 26:
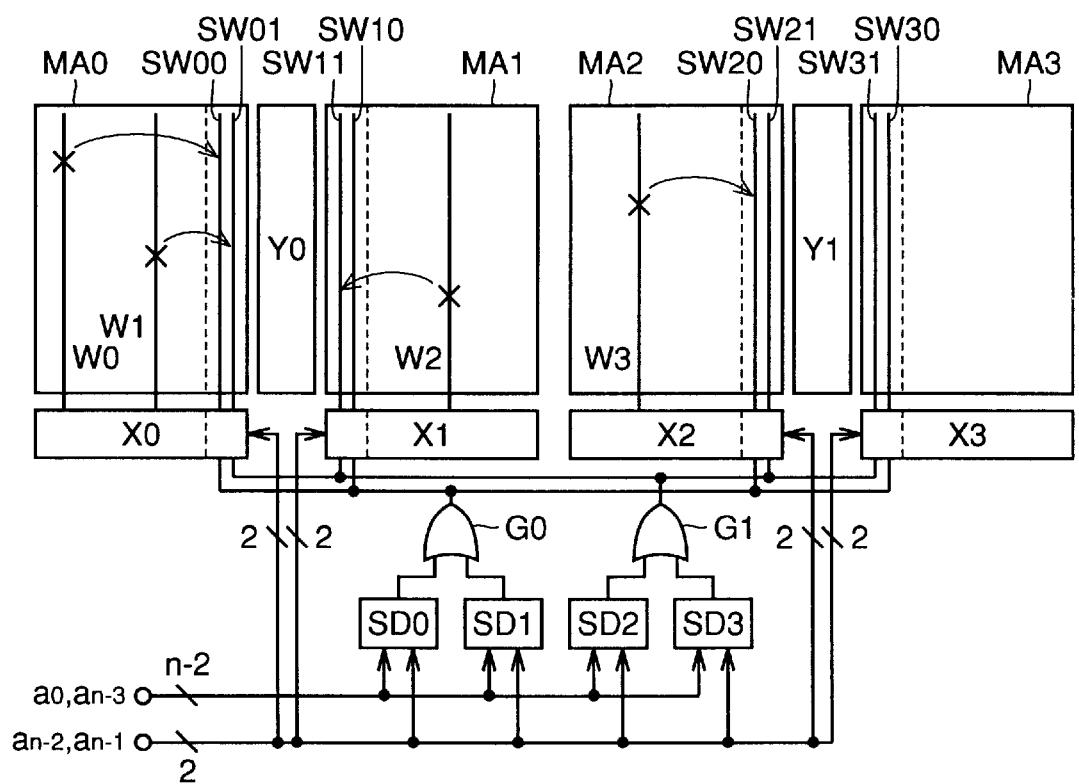
FIG. 26 schematically shows the entire configuration of a semiconductor memory device having a conventional, flexible redundancy configuration.

FIG. 24 is a view for illustrating a second variation in arranging a cache row and bank 1 in the semiconductor memory device according to the third embodiment.

The second variation shown in FIG. 24 differs from the arrangement shown in FIG. 19 in that it is not provided with transfer circuit XG connecting a bit line in row block RB#1 operating as bank 1 and a bit line associated therewith that is provided in cache row block CR in FIG. 19.

Row block RB#1, cache row block CR, sense amplifier portion SAR, spare column block SR and normal row block NR are similar in configuration to those shown in FIG. 19 and the description thereof will thus not be repeated.

In the second variation, data communication between cache row block CR and spare row block SR is provided via local data bus LIO1, global data bus GIO and cache local data bus CLIO.

With such a configuration as described above, flexible row redundancy can be achieved in multi-bank configurations, and redundant repairing capability can be enhanced and chip area can be prevented from increasing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device formed on a main surface of a semiconductor substrate, comprising:

first to nth memory cell blocks each having memory cells arranged in rows and columns, n representing a natural number;

first to nth local data buses provided for said first to nth memory cell blocks, respectively;

first to mth global data buses for communicating data with said memory cell blocks, m representing a natural number smaller than n;

a connection controlling circuit outputting first to mth control signals to connect the first to the mth global data buses to m ones of the first to the nth local data buses, respectively; and first to mth connection circuits provided for connecting the first to the mth global data buses with m ones of the first to the nth local data buses, respectively, an ith connection circuit of the first to the mth connection circuits selectively connecting one of the ith to the (i+n−m)th local data buses with the ith global data bus in response to the ith control signal, i representing a natural number from one to m.

2. The semiconductor memory device according to claim 1, wherein:

m is equal to n minus one; and when a uth memory cell block out of said first to nth memory cell blocks includes a defective memory cell, said connection controlling circuit outputs the first to the (u−1)th control signals to allow the first to the (u−1)th connection circuits to connect the first to the (u−1)th local data buses to the first to the (u−1)th global data buses, respectively, and said connection controlling circuit outputs the uth to the (n−1)th control signals to allow the uth to the (n−1)th connection circuits to connect the (u+1)th to the nth local data buses to the uth to the (n−1)th global data buses, respectively, u representing a natural number of no more than n.

3. The semiconductor memory device according to claim 1, wherein said first to nth memory cell blocks are aligned successively on said main surface along a row direction and constitute a first memory block row, said semiconductor memory device, further comprises:

a second memory block row having n memory cell blocks aligned mutually in the row direction and each having memory cells arranged in rows and columns; wherein said first and second memory block rows are aligned mutually in a column direction, said local data buses include the jth local data bus arranged in a region between said first and second memory block rows adjacent to the jth memory cell block, j representing a natural number from one to m, said connection controlling circuit is arranged between the first to the nth local data buses and said second memory block row, and wherein the first to the mth global data buses are shared by said first and second memory block rows and arranged on said first and second memory block rows parallel to the column direction successively.

4. The semiconductor memory device according to claim 1, wherein:

m is equal to n minus one;

said connection controlling circuit includes first to (n−1)th output nodes outputting said first to (n−1)th control signals, respectively, a first fuse element connected between said first output node and a first internal node serving as a first power supply potential, a kth fuse element connected between (k−1)th and kth ones of said output nodes, k representing a natural number from two to n−1, and an nth fuse element connected between said (n−1)th node and a second internal node supplied with a second power supply potential; and one of said first to nth fuse elements corresponding to a memory cell block having a defective memory cell is cut.

5. The semiconductor memory device according to claim 1, wherein m is equal to n minus one and the sth global data bus is arranged at a boundary between the sth and the (s+1)th memory cell blocks, s representing a natural number from one to (n−1).

6. A semiconductor memory device comprising:

a memory cell array having memory cells arranged in rows and columns, a number of said memory cells being larger than that of memory cells corresponding to a maximal value of an accessed address input to said semiconductor memory device;

an address program circuit having set therein a defective address corresponding to a defective one of said memory cells, and outputting said defective address;

an address comparing circuit comparing a value of an accessed address to said defective address; and an address addition circuit adding a predetermined value to said accessed address in response to an output from said address comparing circuit to output a converted address; wherein said memory cell array communicates stored data according to said converted address to avoid accessing said defective memory cell.

7. The semiconductor memory device according to claim 6, wherein said address comparing circuit includes:

an nth-bit comparing circuit comparing an nth bit corresponding to a most significant bit of said accessed address to an nth bit of said defective address and outputting "1" when the nth bits of said defective address and said accessed address are "1" and "0", respectively;

an ith-bit comparing circuit outputting "1" when ith bits of said defective address and said accessed address are "1" and "0", respectively, as a result of comparing the ith bit of said accessed address to the ith bit of said defective address when (i+1)th to nth bits of said accessed address all match (i+1)th to nth bits of said defective address, i representing one to (n−1); and an NOR circuit outputting a non-disjunction of all of outputs from said first- to nth-bit comparing circuits.

8. The semiconductor memory device according to claim 6, wherein said address addition circuit includes:

first to nth 1-bit addition circuits receiving first to nth bits of said accessed address, respectively, wherein the first 1-bit addition circuit adds a first bit of said accessed address and an output from said address comparing circuit together and outputs a first bit of said converted address and a carry, the ith 1-bit addition circuit adds an ith bit of said accessed address and a carry output from the (i−1)th 1-bit addition circuit together and outputs an ith bit of said converted address and a carry, i representing a natural number of two to (n−1), and the nth 1-bit addition circuit adds an nth bit of said accessed address and a carry output from the (n−1)th 1-bit addition circuit together to output an nth bit of said converted address and also output a carry as an (n+1)th bit of said converted address.

9. A semiconductor memory device constructed on a main surface of a semiconductor substrate, comprising:

first to nth banks each having memory cells arranged in rows and columns and operable independently, n representing a natural number of no less than two;

a global data bus shared by said first to nth banks;

a plurality of local data buses for communicating data between said first to nth banks and said global data bus, respectively;

said first banking including a plurality of normal rows, a plurality of spare rows substitutable for any defective row with a defective memory cell located in said first to nth banks, a plurality of normal bit line pairs shared by said plurality of normal rows and said plurality of spare rows, a plurality of sense amplifiers amplifying potential differences caused respectively in said plurality of normal bit line pairs, and a gate circuit selectively connecting one of said plurality of normal bit line pairs to said local data bus associated therewith;

a cache block provided for said first bank and including a cache row communicating data with said global data bus when said first bank has a normal row and a spare row accessed simultaneously.

10. The semiconductor memory device according to claim 9, wherein said cache block also includes a plurality of cache bit line pairs associated respectively with said plurality of normal bit line pairs, said cache row includes a plurality of cache memory cells associates respectively with said plurality of cache bit line pairs, and said semiconductor memory device farther comprises a transfer circuit connecting said plurality of normal bit line pairs and said plurality of cache bit line pairs associated respectively therewith together, respectively.

11. The semiconductor memory device according to claim 10, further comprising a bank row control circuit activating said spare row and said sense amplifier and then activating said transfer circuit and said cache row associated with said spare row when data is to be transferred from said spare row to said cache row, and activating said transfer circuit, said cache row and said sense amplifier and then activating said spare row associated with said cache row when data is to be transferred from said cache row to said spare row.

* * * * *